(12) United States Patent
Yang et al.

(10) Patent No.: US 11,856,678 B2
(45) Date of Patent: Dec. 26, 2023

(54) METHOD OF MEASURING A GRAPHITE ARTICLE, APPARATUS FOR A MEASUREMENT, AND INGOT GROWING SYSTEM

(71) Applicant: SENIC INC., Cheonan-si (KR)

(72) Inventors: Eun Su Yang, Suwon-si (KR); Jong Hwi Park, Suwon-si (KR); Jung Woo Choi, Suwon-si (KR); Byung Kyu Jang, Suwon-si (KR); Sang Ki Ko, Suwon-si (KR); Jongmin Shim, Hwaseong-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 582 days.

(21) Appl. No.: 17/078,570

(22) Filed: Oct. 23, 2020

(65) Prior Publication Data

US 2021/0127462 A1    Apr. 29, 2021

(30) Foreign Application Priority Data

Oct. 29, 2019  (KR) .......................... 10-2019-0135383
Aug. 31, 2020  (KR) .......................... 10-2020-0110081
Aug. 31, 2020  (KR) .......................... 10-2020-0110090

(51) Int. Cl.
*H05B 6/10*    (2006.01)
*H05B 6/36*    (2006.01)
(Continued)

(52) U.S. Cl.
CPC ............ *H05B 6/105* (2013.01); *G01R 27/16* (2013.01); *G01R 27/2611* (2013.01); *G01R 27/2688* (2013.01); *H05B 6/36* (2013.01)

(58) Field of Classification Search
CPC .... G01R 27/16; G01R 27/26; G01R 27/2611; G01R 27/2688; H05B 6/105; H05B 6/36; H05B 6/02; H05B 6/10; H05B 6/362
See application file for complete search history.

(56) References Cited

U.S. PATENT DOCUMENTS 4,891,591 A * 1/1990 Johnston .............. G01N 33/442
                                                    526/60
6,051,970 A * 4/2000 Hutchings ............ G01N 27/023
                                                    73/53.07
(Continued)

FOREIGN PATENT DOCUMENTS

CA       3168762 A1 * 11/2021 ............. A24F 40/20
CN     102177283 A  *  9/2011 ............. C30B 13/14
(Continued)

OTHER PUBLICATIONS

Taiwanese Office Action dated May 3, 2022, in counterpart Taiwanese Patent Application No. 110128404 (9 pages in Chinese).
(Continued)

*Primary Examiner* — Jermele M Hollington
*Assistant Examiner* — Sean Curtis
(74) *Attorney, Agent, or Firm* — NSIP Law

(57) ABSTRACT

Example embodiments relate to a method of measurement, an apparatus for measurement, and an ingot growing system that measure properties relating an induction heating characteristic of a graphite article. The method of measurement comprises an arranging step of arranging a graphite article to the coil comprising a winded conducting wire; and a measuring step of applying power for measurement to the coil through means of measurement connected electronically to the coil, and measuring electromagnetic properties induced in the coil. The method of measurement and the like measure electromagnetic properties of graphite articles like an ingot growing container, and an insulating material, and provide (Continued)

data required for selecting so that further enhanced reproducibility for growth of an ingot can be secured.

19 Claims, 13 Drawing Sheets

(51) Int. Cl.
*G01R 27/26* (2006.01)
*G01R 27/16* (2006.01)

(56) References Cited

U.S. PATENT DOCUMENTS

| | | | | |
|---|---|---|---|---|
| 7,000,678 | B1 * | 2/2006 | Mon | C30B 29/06 |
| | | | | 373/138 |
| 9,579,828 | B2 * | 2/2017 | Guichard | B29C 33/02 |
| 9,777,401 | B2 * | 10/2017 | Ueta | C30B 29/36 |
| 11,359,306 | B2 * | 6/2022 | Park | C23C 14/50 |
| 2004/0050320 | A1 * | 3/2004 | Maruyama | C30B 23/00 |
| | | | | 117/84 |
| 2006/0037733 | A1 * | 2/2006 | Mon | C30B 11/002 |
| | | | | 164/467 |
| 2010/0132410 | A1 * | 6/2010 | Nypelo | C03B 5/021 |
| | | | | 65/483 |
| 2014/0183178 | A1 * | 7/2014 | Guichard | H05B 6/06 |
| | | | | 219/243 |
| 2016/0032487 | A1 * | 2/2016 | Ueta | C30B 23/066 |
| | | | | 117/84 |
| 2016/0040317 | A1 * | 2/2016 | Ueta | C30B 29/36 |
| | | | | 117/85 |
| 2018/0251909 | A1 * | 9/2018 | Nakabayashi | H01L 21/02529 |
| 2021/0123157 | A1 * | 4/2021 | Park | C30B 23/025 |
| 2021/0127462 | A1 * | 4/2021 | Yang | C30B 29/36 |
| 2023/0137819 | A1 * | 5/2023 | Lee | A24F 40/70 |
| | | | | 131/328 |

FOREIGN PATENT DOCUMENTS

| | | | | | |
|---|---|---|---|---|---|
| CN | 105112993 | A | * | 12/2015 | |
| CN | 205864774 | U | * | 1/2017 | |
| CN | 109280964 | A | * | 1/2019 | ............ C30B 23/00 |
| CN | 112748155 | A | * | 5/2021 | ............ C30B 15/10 |
| CN | 115233300 | A | * | 10/2022 | |
| EP | 2232947 | B1 | * | 9/2013 | ............ H05B 6/067 |
| EP | 3916138 | A1 | * | 12/2021 | ........... C30B 23/002 |
| EP | 3961200 | A1 | * | 3/2022 | ............ C30B 15/10 |
| JP | 07-112959 | B2 | | 9/1989 | |
| JP | 2000-096216 | A | | 4/2000 | |
| JP | 2008-074663 | A | | 4/2008 | |
| JP | 4218993 | B2 | * | 2/2009 | |
| JP | 2010-059031 | A | | 3/2010 | |
| JP | 2010-202414 | A | | 9/2010 | |
| JP | 2011-26161 | A | | 2/2011 | |
| JP | 2012-001435 | A | | 1/2012 | |
| JP | 2013-126931 | A | | 6/2013 | |
| JP | 2014-108915 | A | | 6/2014 | |
| JP | 2017065969 | A | * | 4/2017 | |
| JP | 2019-210199 | A | | 12/2019 | |
| JP | 2022041881 | A | * | 3/2022 | ............ C30B 15/10 |
| KR | 10-2006-0134764 | A | | 12/2006 | |
| KR | 10-2011-0057203 | A | | 5/2011 | |
| KR | 10-1059960 | B1 | | 8/2011 | |
| KR | 10-2012-0030836 | A | | 3/2012 | |
| KR | 10-2012-0130030 | A | | 11/2012 | |
| KR | 10-2014-0024140 | A | | 2/2014 | |
| KR | 10-2014-0104500 | A | | 8/2014 | |
| KR | 10-1696606 | B1 | | 1/2017 | |
| KR | 10-2017-0102288 | A | | 9/2017 | |
| KR | 20200047107 | A | * | 5/2020 | |
| KR | 102215441 | B1 | * | 2/2021 | |
| KR | 20210050857 | A | * | 5/2021 | |
| KR | 102262866 | B1 | * | 6/2021 | |
| SU | 746465 | A1 | * | 7/1980 | |
| SU | 1717277 | A1 | * | 3/1992 | |
| TW | 200912333 | A | | 3/2009 | |
| TW | 201337982 | A | | 9/2013 | |
| TW | 1783607 | B | * | 11/2022 | |
| WO | WO-2007020706 | A1 | * | 2/2007 | ........... B22D 11/001 |
| WO | WO 2016/152813 | A1 | | 9/2016 | |
| WO | WO-2016152813 | A1 | * | 9/2016 | ........... C30B 23/002 |

OTHER PUBLICATIONS

Japanese Office Action dated Aug. 16, 2022, in counterpart Japanese Patent Application No. 2021-102006 (3 pages in Japanese).

* cited by examiner

METHOD OF MEASURING A GRAPHITE ARTICLE, APPARATUS FOR A MEASUREMENT, AND INGOT GROWING SYSTEM

CROSS REFERENCE TO RELATED APPLICATIONS

This application claims the benefit under 35 USC § 119(a) of Korean Patent Application Nos.

10-2019-0135383 filed on Oct. 29, 2019, 10-2020-0110081, filed on Aug. 31, 2020, and 10-2020-0110090, filed on Aug. 31, 2020, in the Korean Intellectual Property Office, the entire disclosures of which are incorporated herein by reference for all purposes.

1. Field

The present disclosure relates to a method of measuring graphite articles, an apparatus for measurement, and an ingot growing system. Example embodiments relates to an apparatus for measurement of an ingot growing container, and a method of measuring an ingot growing container using the apparatus. Example embodiments relates to an apparatus for measurement of an insulating material, and a method of measuring an insulating material using the apparatus.

2. Description of the Background

Induction heating is a method of supplying high frequency alternating current to a coil and heating the object to be heated using Joule heating caused from an eddy current generated from electromagnetic induction action.

When an ingot is grown by an apparatus equipped with an induction heating means and an insulating material, characteristics of each of an ingot growing container and an insulating material such as the weight (density), thermal conductivity, electric resistance, and the like may affect growth of an ingot considerably. Accordingly, electromagnetic properties of an ingot growing container and/or an insulating material are needed to be apprehend before the proceeding, in terms of securing reproducibility of growth of an ingot.

The background art described above is technical information possessed by inventors for deriving the content presented in the specification, or acquired from the process for derivation, so that it cannot be referred necessarily as notice art which is opened to the public before application of the content presented in the specification.

As for a related prior art, there is "Method for Evaluating Silica Glass Crucible, Method for Producing Silicon Single Crystals" presented in Korea Patent Publication No. 10-2014-0104500.

SUMMARY

One object of example embodiments is to provide a method of measuring properties relating to an induction heating characteristic of graphite articles, an apparatus for measurement, an ingot growing system, and the like.

Another object of example embodiments is to provide an apparatus for measuring an ingot growing container, which can measure and select electromagnetic properties of an ingot growing container in a more simplified method, a method of measuring an ingot growing container, and the like. In addition, more enhanced reproducibility can be secured when a selected ingot growing container is applied to growth of an ingot, by measuring and selecting electromagnetic properties of ingot growing containers.

Another object of example embodiments is to provide an apparatus for measuring an insulating material, which can measure electromagnetic properties of an insulating material in a more simplified method, and a method of measuring an insulating material. In addition, more enhanced reproducibility can be secured when electromagnetic properties of an insulating material are measured, and the insulating material is applied to growth of an ingot by the result.

In one general aspect, a method of measurement includes an arranging step of arranging a graphite article to a coil including a winded conducting wire; and a measuring step of measuring electromagnetic properties induced to the coil, after applying power for measurement to the coil through a measuring means connected electronically with the coil, thereby measuring properties relating to an induction heating characteristic of a graphite article.

The electromagnetic properties may include a factor relating to change of induced electromotive force generated in the coil due to the graphite article, or a factor relating to resistance of the graphite article.

The electromagnetic properties may be one or more selected from the group consisting of equivalent series resistance, equivalent series resistance inductance, and quality factor of the coil.

The graphite article may have a cylindrical appearance, generally.

The graphite article may be an ingot growing container and/or an insulating material.

The ingot growing container has a section in the shape of a circle or an ellipse, substantially, and internal space. The ingot growing container may have a cylindrical shape which has a section in the shape of a circle or an ellipse, internal space, a closed lower portion, and an opened upper portion.

The insulating material may have a section in the shape of a circle or an ellipse, and the upper portion and the lower portion may be opened. In addition, the insulating material may have a section in the shape of a circle or an ellipse, and the upper portion and the lower portion may be closed.

The coil may have accommodation space located in the internal.

The ingot growing container may be arranged in the accommodation space.

The insulating material may be arranged in the external of the coil.

The length of the accommodation space may be 100 mm or more.

The length of the accommodation space may be shown to be different depending on the method of measurement, so that the length has to be measured horizontally from the floor, substantially, and the length is based on the inner diameter of a coil in the shape of a circle or a cylinder. In addition, when the length is different depending on the height for measurement, the length is based on the longest length. When the section of the coil has a circle shape, the diameter of the accommodation space is treated as the length of the accommodation space.

The coil has a perimeter length of the inner diameter, and the perimeter length of the inner diameter (unit: mm) and the sectional area of conducting wires of the coil (unit:$mm^2$) may have a ratio of 100:1.57 to 161.

The section of the coil has a thickness in x direction measured in the x direction which is horizontal to the bottom or the top of the graphite article, and a thickness in z direction measured in the z direction which is perpendicular to the x direction. The coil may have a flat spiral coil shape in which the thickness in the x direction is the same with or greater than the thickness in the z direction.

The coil in the flat spiral coil shape has a perimeter length of the inner diameter, and the perimeter length of the inner diameter (unit: mm) and the thickness (mm) of the conducting wire may have a ratio of 100:0.194 to 1.09.

The graphite article may be an ingot growing container, and the ingot growing container may have a value of equivalent series resistance measured by applying AC power of 100 kHz and 0.1 A to the coil in the flat spiral coil shape, and the value of equivalent series resistance may be 2.35Ω to 4.56Ω.

The section of the coil has a thickness in x direction measured in the x direction which is horizontal to the bottom or the top of the graphite article, and a thickness in z direction measured in the z direction which is perpendicular to the x direction. The coil may have an aircore coil shape in which the thickness in the x direction is greater than the thickness in the z direction.

The coil in the aircore coil shape has a perimeter length of the inner diameter, and the perimeter length of the inner diameter (unit: mm) and the thickness (mm) of the conducting wire may have a ratio of 100:0.194 to 1.09.

The graphite article may be an ingot growing container, and the ingot growing container may have a value of equivalent series resistance measured by applying AC power of 100 kHz and 0.1 A to the coil in the aircore coil shape, and the value of equivalent series resistance may be 3.50Ω to 7.24Ω.

The graphite article may be an insulating material, and the insulating material may have a value of equivalent series resistance measured by applying AC power of 100 kHz and 0.1 A to the coil in the aircore coil shape, and the value of equivalent series resistance may be 10.57Ω to 14.16Ω.

In another general aspect, an apparatus for measurement includes a coil including a winded conducting wire; and a means of measurement connected electronically to the coil. The means of measurement applies power for measurement to the coil thereby measuring electromagnetic properties of a graphite article, and the electromagnetic properties are properties relating to an induction heating characteristic.

The electromagnetic properties may be one or more selected from the group consisting of equivalent series resistance, equivalent series inductance, and quality factor of the coil.

The coil may have accommodation space located in the internal.

The ingot growing container may be arranged in the accommodation space.

The insulating material may be arranged in the external of the coil.

The length of the accommodation space may be 100 mm or more.

The length of the accommodation space may be shown to be different depending on the method of measurement, so that the length has to be measured horizontally from the floor, substantially, and the length is based on the inner diameter of a coil in the shape of a circle or a cylinder. In addition, when the length is different depending on the height for measurement, the length is based on the longest length. When the section of the coil has a circle shape, the diameter of the accommodation space is treated as the length of the accommodation space.

The coil has a perimeter length of the inner diameter, and the perimeter length of the inner diameter (unit: mm) and the sectional area of conducting wires of the coil (unit:mm$^2$) may have a ratio of 100:1.57 to 161.

The section of the coil has a thickness in x direction measured in the x direction which is horizontal to the bottom or the top of the graphite article, and a thickness in z direction measured in the z direction which is perpendicular to the x direction. The coil may have a flat spiral coil shape in which the thickness in the x direction is the same with or greater than the thickness in the z direction.

The coil in the flat spiral coil shape has a perimeter length of the inner diameter, and the perimeter length of the inner diameter (unit: mm) and the thickness (mm) of the conducting wire may have a ratio of 100:0.194 to 1.09.

The graphite article may be an ingot growing container, and the ingot growing container may have a value of equivalent series resistance measured by applying AC power of 100 kHz and 0.1 A to the coil in the flat spiral coil shape, and the value of equivalent series resistance may be 2.35Ω to 4.56Ω.

The section of the coil has a thickness in x direction measured in the x direction which is horizontal to the bottom or the top of the graphite article, and a thickness in z direction measured in the z direction which is perpendicular to the x direction. The coil may have an aircore coil shape in which the thickness in the z direction is greater than the thickness in the x direction.

The coil in the aircore coil shape has a perimeter length of the inner diameter, and the perimeter length of the inner diameter (unit: mm) and the thickness (mm) of the conducting wire may have a ratio of 100:0.194 to 1.09.

The graphite article may be an ingot growing container, and the ingot growing container may have a value of equivalent series resistance measured by applying AC power of 100 kHz and 0.1 A to the coil in the aircore coil shape, and the value of equivalent series resistance may be 3.50Ω to 7.24Ω.

The graphite article may be an insulating material, and the insulating material may have a value of equivalent series resistance measured by applying AC power of 100 kHz and 0.1 A to the coil in the aircore coil shape, and the value of equivalent series resistance may be 10.57Ω to 14.16Ω.

In another general aspect, an ingot growing system is a system of growing a silicon carbide ingot by including a graphite article and a heating means, and the ingot growing container includes a main body having internal space in which a material is arranged; and a silicon carbide seed arranged in an upper portion of the main body or on the main body, wherein the graphite article is an ingot growing container or an insulating material, the graphite article has a value of equivalent series resistance which is a value of electronical indirect properties, the ingot growing container has a value of equivalent series resistance of 3.50Ω to 7.24Ω measured by applying AC power of 100 kHz and 0.1 A, and the insulating material may have a value of equivalent series resistance of 10.57Ω to 14.16Ω measured by applying AC power of 100 kHz and 0.1 A.

The silicon carbide ingot may be induced to grow in rate of 100 mm/hr or more.

In one general aspect, an apparatus for measuring an ingot growing container includes a coil including a winded conducting wire; and a means of measurement connected electronically to the coil, and the means of measurement applies power for measurement to the coil thereby measuring electromagnetic properties of an ingot growing container.

The electromagnetic properties may include a factor relating to change of induced electromotive force generated in the coil due to the ingot growing container, or a factor relating to resistance of the ingot growing container.

The ingot growing container may be arranged in a range affected by induced electromotive force to be induced to power applied to the coil.

The coil has accommodation space and the ingot growing container may be located in the accommodation space.

The section of the coil has a thickness in x direction measured in x direction which is horizontal to the bottom or the top of the ingot growing container, and a thickness in z direction measured in the z direction which is perpendicular to the x direction. The coil may have an aircore coil shape in which the thickness in the z direction is greater than the thickness in the x direction.

The length of accommodation space may be 100 mm or more.

The ingot growing container may be a graphite crucible for growth of an ingot.

The means of measurement may be an LCR meter.

The electromagnetic properties may be one or more selected from the group consisting of equivalent series resistance, equivalent series inductance, and quality factor of the coil.

When the ingot growing container is heated through an induction heating means, the coefficient of determination ($R^2$) between the electromagnetic properties and a direct current value of flowing in an ingot growing container, or a factor relating to the same, may be 0.9 or more.

The side of the ingot growing container has a perimeter length, and the perimeter length (mm) and the sectional area (mm$^2$) of conducting wires of the coil may have a ratio of 100:1.57 to 161.

The ingot growing container has a perimeter length, and the perimeter length (mm) and the thickness (mm) of conducting wire may have a ratio of 100:0.194 or 1.09.

In one general aspect, a method of measuring an ingot growing container may include arranging step of arranging an ingot growing container to a coil including a winded conducting wire; and a measuring step of measuring electromagnetic properties induced to the coil, after applying power for measurement to the coil through a measuring means connected electronically with the coil.

In one general aspect, an ingot growing container includes graphite, and may have a value of equivalent series resistance of 2.35Ω to 4.56Ω measured by applying AC power of 100 kHz and 0.1 A to the apparatus for measuring an ingot growing container in the flat spiral coil shape.

In one general aspect, an ingot growing container includes graphite, and may have a value of equivalent series resistance of 3.50Ω to 7.24Ω measured by applying AC power of 100 kHz and 0.1 A to the apparatus for measuring an ingot growing container in the aircore coil shape.

In one general aspect, an apparatus for measuring an insulating material includes a coil including a winded conducting wire; and a means of measurement connected electronically to the coil, wherein the means of measurement may apply power for measurement to the coil thereby measuring electromagnetic properties of an insulating material.

The electromagnetic properties may include a factor relating to change of induced electromotive force generated in the coil by the insulating material, or a factor proportional to resistance of the insulating material.

The insulating material may be arranged in a range affected by induced electromotive force to be induced to power applied to the coil.

The coil has accommodation space located in the internal, and the insulating material may be formed surrounding the external of the coil.

The section of the coil has a thickness in x direction measured in the x direction which is horizontal to the bottom or the top of the insulating material, and a thickness in z direction measured in the z direction which is perpendicular to the x direction in the side direction of the insulating material. The coil may have an aircore coil shape in which the thickness in the z direction is the same with or greater than the thickness in the x direction.

The electromagnetic properties may be one or more selected from the group consisting of equivalent series resistance, equivalent series inductance, and quality factor of the coil.

A method of measuring an insulating material according to one or more examples may include an arranging step of arranging an insulating material to adjoin a coil including a winded conducting wire; and a measuring step of applying power for measurement to the coil through a means of measurement connected electronically to the coil, and measuring electromagnetic properties induced to the coil.

An insulating material for growth of an ingot includes an ingot growing container; and an insulating material surrounding the external of the ingot growing container, wherein a value of equivalent series resistance measured by applying AC power of 100 kHz and 0.1 A to the apparatus for measuring an insulating material according to example embodiments may be 10.57Ω to 14.16Ω.

A method of measuring a graphite article, an apparatus for measurement, an ingot growing system, and the like according to example embodiments can measure electromagnetic properties of a graphite article reliably in a comparatively simple method during a short time.

When a method of measurement and the like are applied, electromagnetic properties of an ingot growing container can be measured reliably in a comparatively simple method during a short time. In addition, when an ingot is allowed to grow through induction heating of an ingot growing container, electromagnetic properties like resistance had by an ingot growing container and thermal properties induced from the same can be predicted, so that data for selecting an ingot growing container which has more advantaged properties can be provided. Accordingly, reproducibility of growth of an ingot can be secured more reliably. Additionally, electromagnetic properties of an ingot growing container can be measured in a quick and simplified method.

In addition, when a method of measurement and the like are applied, electromagnetic properties of an insulating material can be measured reliably in a comparatively simple method during a short time. Additionally, when an ingot is allowed to grow through induction heating of an ingot growing container, resistance and electromagnetic properties had by not only an ingot growing container but also an insulating material, and thermal properties induced from the same can be predicted, so that data about an insulating material having more advantaged properties can be provided. Accordingly, reproducibility of growth of an ingot can be secured and electromagnetic properties of an insulating material can be measured in a quick and simplified method.

DETAILED DESCRIPTION

Figure 1:
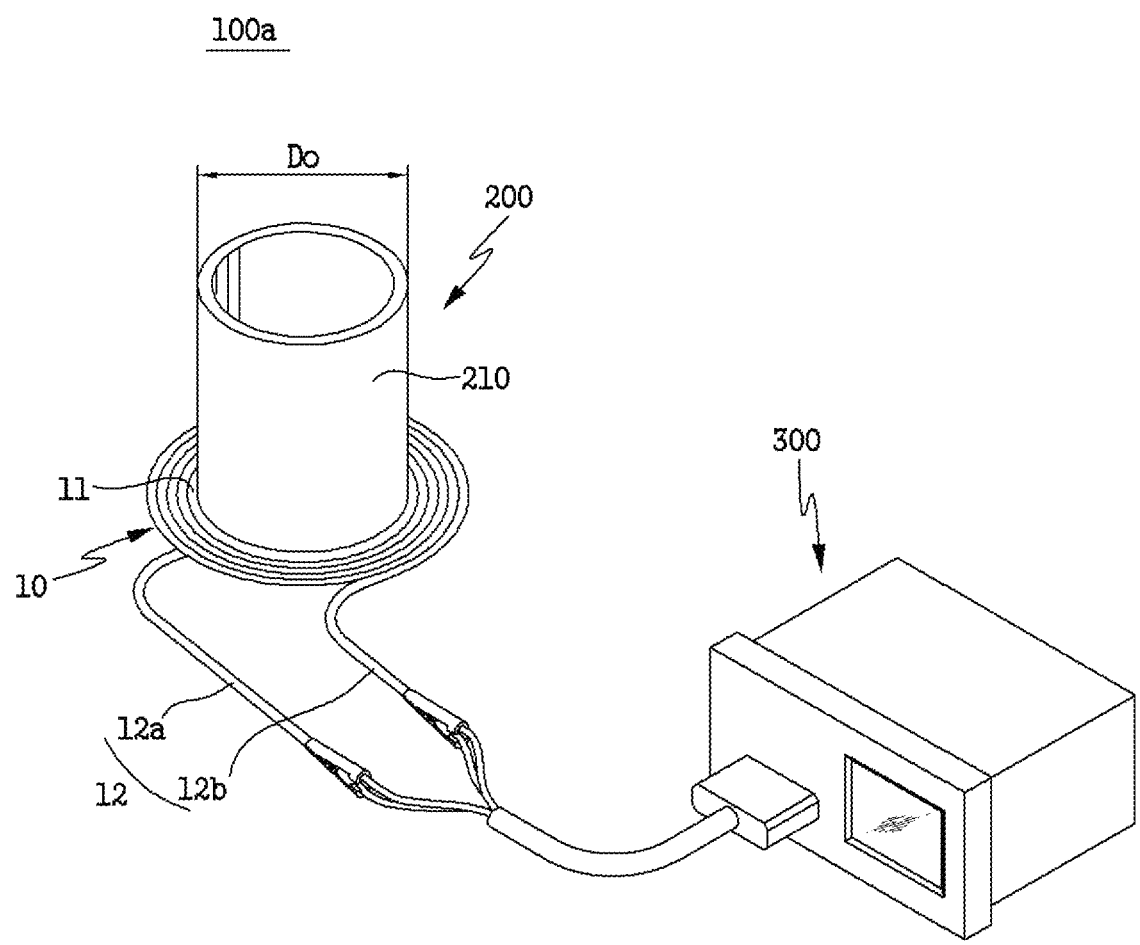
FIG. 1 and FIG. 2 are conceptual views showing examples of apparatus for measurement of an ingot growing container according to one or more examples.

Hereinafter, example embodiments of the present disclosure will be described in detail referring to attached drawings such that they can easily be made by those skilled in the art to which the present disclosure pertains. The present disclosure may, however, be embodied in many different forms and should not be construed as limited to exemplary embodiments set forth herein. Like reference numerals indicate like elements throughout the specification and drawings.

In the present specification, the phrase that a certain component "comprises" another component means that the certain component may further include one or more components but does not preclude the presence or addition of one or more other components, unless specifically stated to the contrary.

In the present specification, the phrase that a certain component is "connected" to another component includes not only 'directly connected' but also 'connected having other intervening components therebetween'.

In the present specification, it will be understood that when "B" is referred to as being on "A", "B" can be directly on "A" or intervening other component(s) may be present therebetween. That is, the location of "B" is not construed as being limited to direct contact of "B" with the surface of "A".

In the present specification, the term "combination of" included in Markush type description means mixtures or combinations of one or more components described in expression of Markush type and therefore means including one or more elements selected from the group consisting of the component.

In the present specification, the description "A and/or B" means "A, B, or A and B."

In the present specification, the terms such as "first" and "second" or "A" and "B" are used to distinguish one from another for the same element, unless specifically stated otherwise.

In the present specification, it will be understood that when "B" is referred to as being on "A", "B" can be directly on "A" or intervening other component(s) may be present therebetween. That is, the location of "B" is not construed as being limited to direct contact of "B" with the surface of "A".

In the present specification, the singular forms "a", "an" and "the" are intended to include the plural forms as well, unless context clearly dictates otherwise.

Several types of graphite articles are applied to growth of an ingot, and electromagnetic properties thereof greatly affect a grown ingot but in many cases, the graphite articles have electromagnetic properties different from each other even when they are articles having the same shape or weight, so that this is being a setback in securing reproducibility of growth of an ingot.

An ingot growing container and/or an insulating material will be described as exemplification. When an ingot is allowed to grow inside an ingot growing container by applying a method of induction heating, the properties such as weight, density, thermal conductivity, and electronical resistance of an ingot growing container and/or an insulating material surrounding the same may considerably affect growth of an ingot.

Each ingot growing container has a difference in the properties among a plurality of ingot growing container, the difference is also in the properties such as thermal conductivity, and electronical resistance as well as weight which is comparatively easily measurable, and such a difference may affect growth rate or quality of an ingot which is allowed to grow using the same. The properties such as thermal conductivity, electronic resistance of an ingot growing container itself can be checked if induction heating is performed directly to an ingot growing container, but proceeding of induction heating needs comparatively long time, and efficiency of measurement is lowered because heating and cooling processes of the entire ingot growing container have to be done.

In addition, each insulating material has difference in the properties, the difference is also in the properties such as thermal conductivity, and electronical resistance as well as weight which is comparatively easily measurable, and such a difference may affect growth rate or quality of an ingot when the ingot is allowed to grow. Thermal conductivity, electronical resistance, and the like of each insulating material can be checked if induction heating is performed, but proceeding of induction heating needs comparatively long time, and efficiency of measurement is lowered because heating and cooling processes of an insulating material or an ingot growing container have to be done, and the performance of an insulating material may be changed in an induction heating process.

The inventors present an apparatus for measuring an ingot growing container and a method of measuring an ingot growing container, that are developed for sufficient reproducibility to be secured when an ingot is grown by apprehending electromagnetic properties of an ingot growing container in advance using a considerably simple method.

Additionally, the inventors present an apparatus for measuring an insulating material and a method of measuring an insulating material, that are for sufficient reproducibility to be secured when an ingot is grown by apprehending electromagnetic properties of an insulating material in advance using a considerably simple method.

Apparatus for Measurement

An apparatus according to one or more examples comprises a coil comprising a winded conducting wire; a means of measurement connected electronically to the coil, wherein the means of measurement applies power for measurement to the coil thereby measuring electromagnetic properties of a graphite article. The electromagnetic properties are properties relating to an induction heating characteristic.

Figure 2:
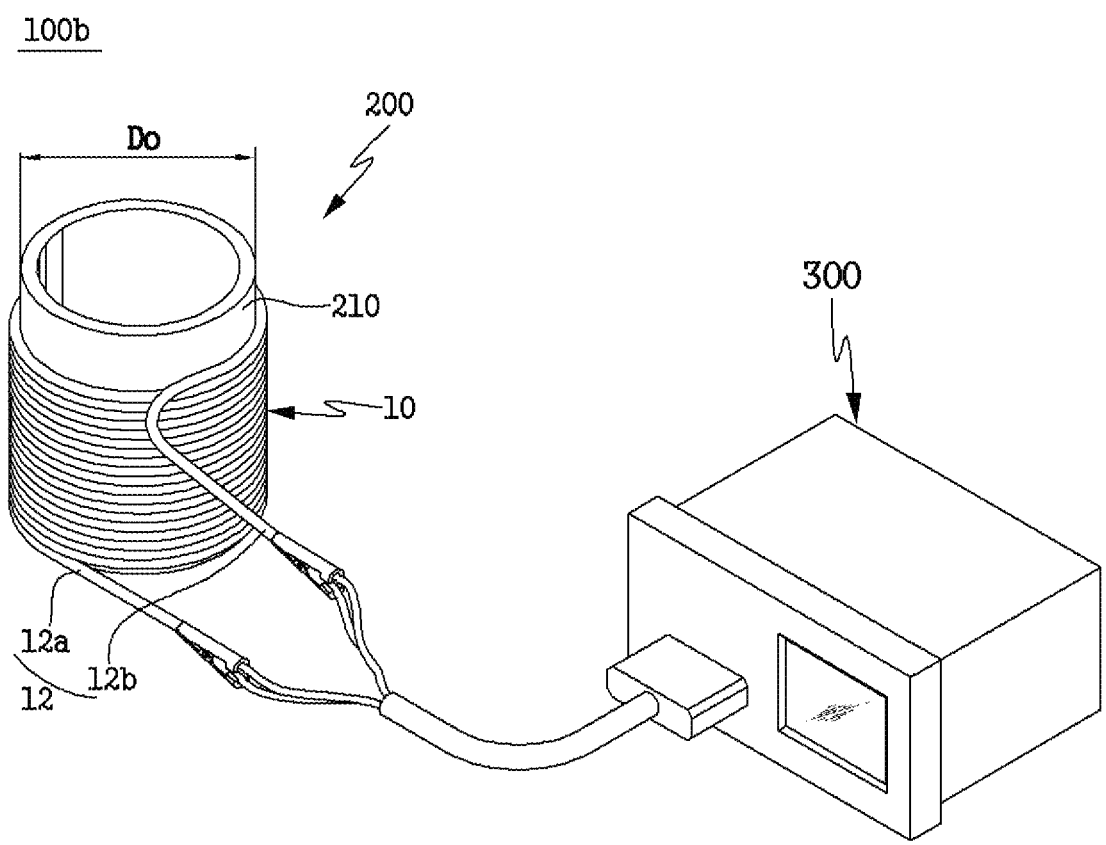
Figure 3:
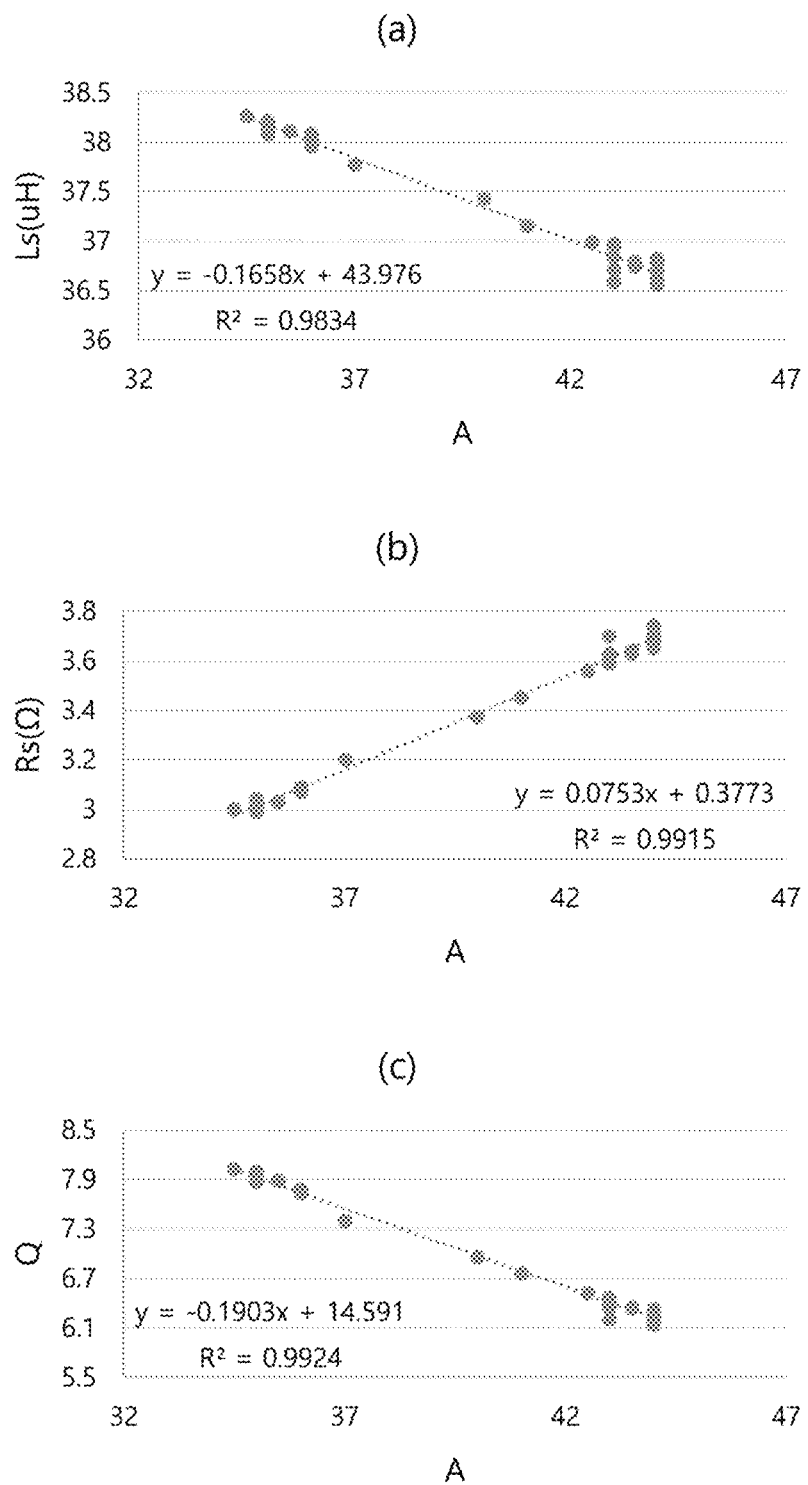
FIG. 3 is a graph showing relation of a direct current value of an ingot growing container when induction heating of the ingot growing container is performed and an electromagnetic property value induced to a flat spiral coil, in one or more examples.
Figure 4:
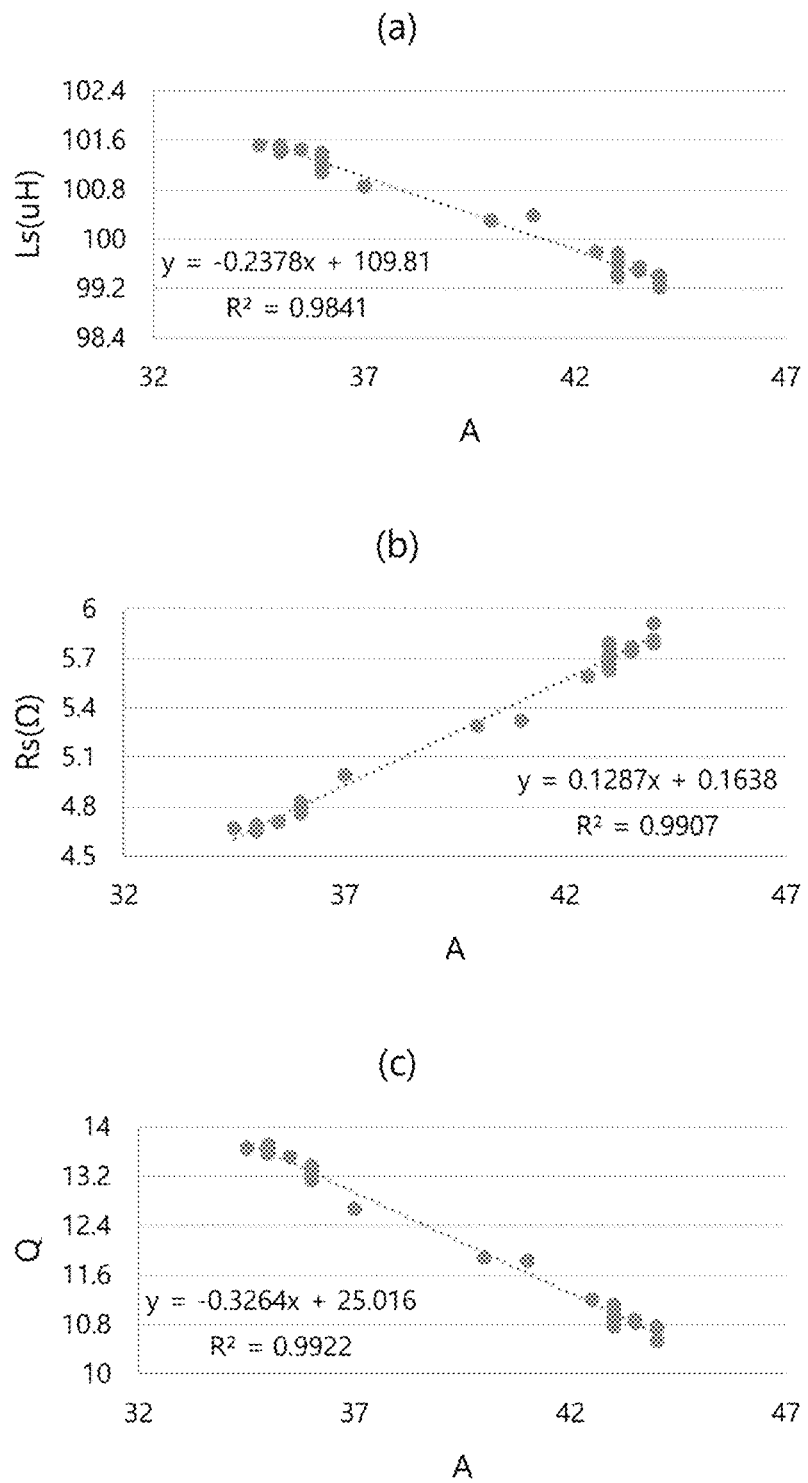
FIG. 4 is a graph showing relation of a direct current value of an ingot growing container when induction heating of the ingot growing container is performed and an electromagnetic property value induced to an aircore coil, in one or more examples.
Figure 5:
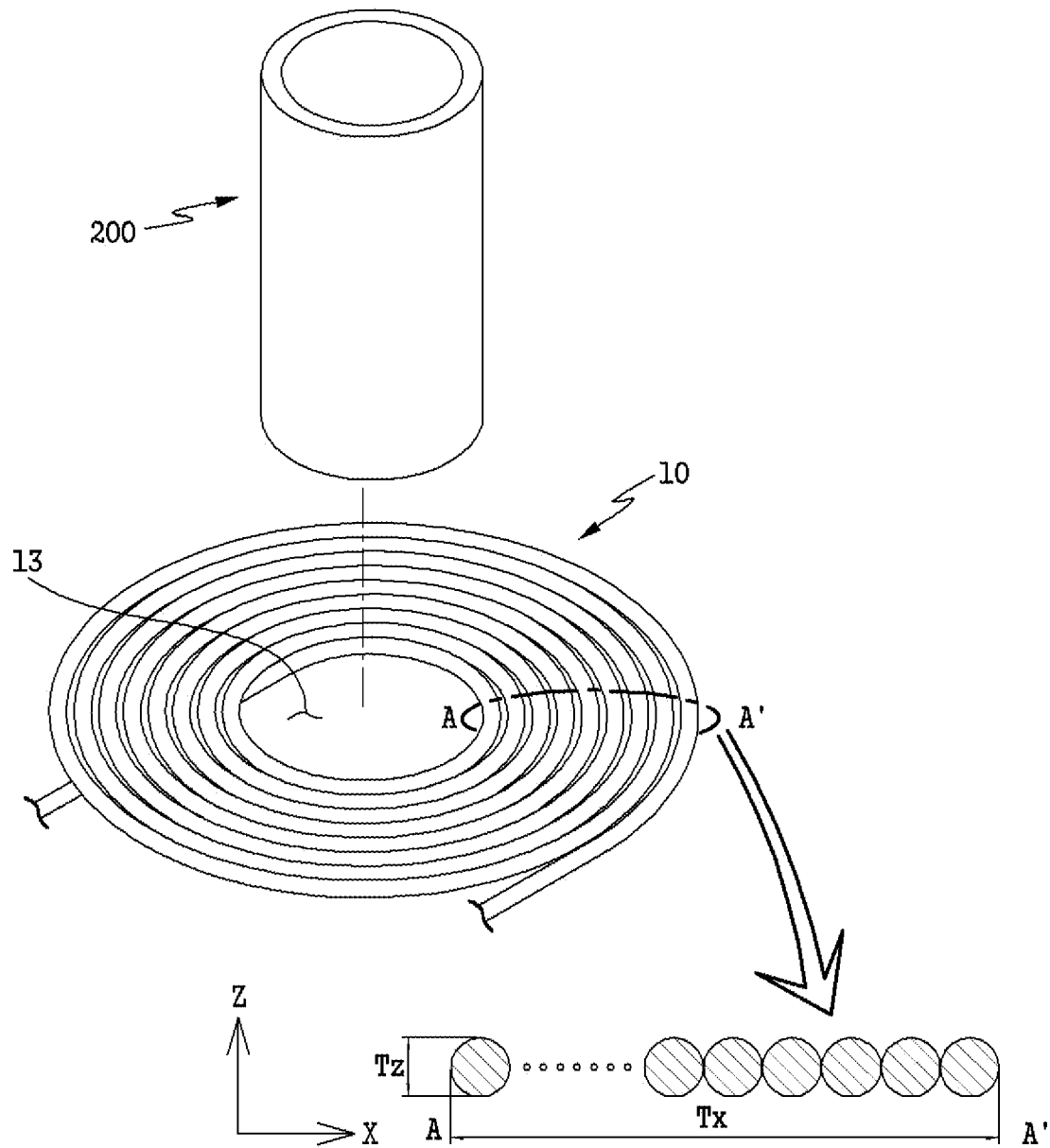
FIG. 5 and FIG. 6 are conceptual views showing examples of coils of apparatus for measuring an ingot growing container and the sections thereof according to one or more examples.
Figure 6:
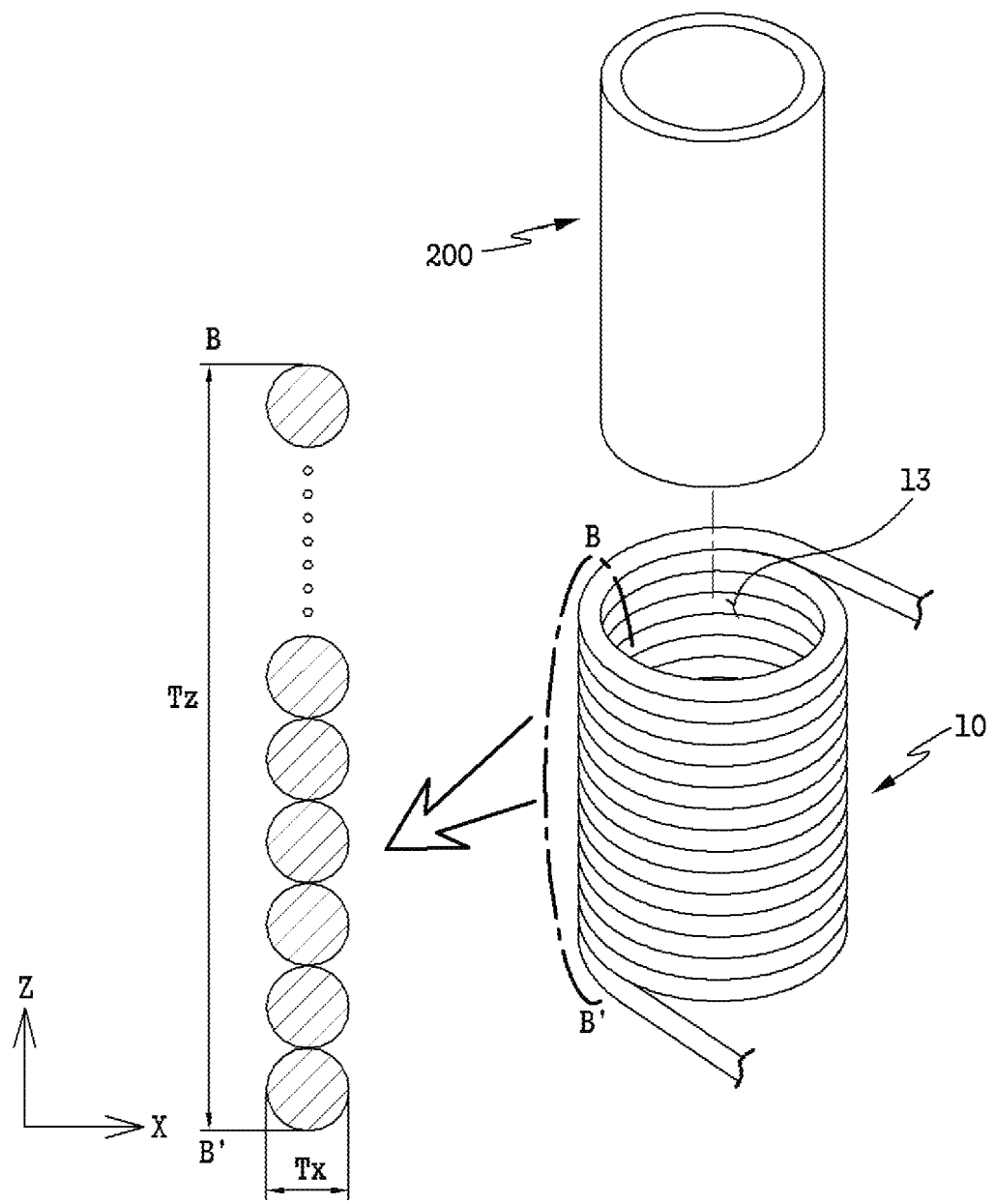

FIG. 1 and FIG. 2 are conceptual views showing examples of apparatus for measurement of an ingot growing container according to one or more examples. FIG. 3 is a graph showing relation of a direct current value of an ingot growing container when induction heating of the ingot growing container is performed and an electromagnetic property value induced to a flat spiral coil, in one or more examples. FIG. 4 is a graph showing relation of a direct current value of an ingot growing container when induction heating of the ingot growing container is performed and an electromagnetic property value induced to am aircore coil, in one or more examples. FIG. 5 and FIG. 6 are conceptual views showing examples of coils of apparatus for measuring an ingot growing container and the section thereof according to one or more examples.

Hereinafter, example embodiments will be described in more detail with an ingot growing container as exemplification of a graphite article, referring the drawings.

An apparatus for measuring an ingot growing container 100a, 100b according to one or more examples comprises a coil 10 comprising a winded conducting wire; and a means of measurement 300 connected electronically to the coil, wherein the means of measurement applies power for measurement to the coil thereby measuring electromagnetic properties of an ingot growing container 200.

The electromagnetic properties may be a factor relating to variation of induced electromotive force generated in the coil 10 by the ingot growing container 200. Induced electromotive force refers to electromotive force generated from variation of magnetic flux, and when the power for measurement applied to the coil is AC power, an induced current is formed in the ingot growing container by alternating magnetic field to be generated, and thereby induced electromotive force may be applied to a coil.

The electromagnetic properties may also be a factor relating to resistance of the ingot growing container 200.

The electromagnetic properties may be induced when AC power for measurement having specific frequency and voltage is applied through the means of measurement 300 to a coil 10 in which an ingot growing container 200 is accommodated in the internal. The AC power for measurement may be 1 mHz to 200 khz, or may be 10 Hz to 100 kHz. A voltage of the AC power may be 5 mV to 5 V, or may be 10 mV to 5 V. When the AC power has the above range of frequency and voltage, purposed electronical properties may be induced effectively to occur in the coil.

When the ingot growing container is heated through an induction heating means to which power of a certain frequency or voltage is added, the coefficient of determination ($R^2$) between the electromagnetic properties and a direct current value of an ingot growing container, or a factor relating to the same, may be 0.9 or more, or the coefficient of determination may be 0.95 or more. The coefficient of determination may be 0.9999 or less, or may be 0.999 or less. In addition, the electronical properties may have linear relation with the direct current value. If the electromagnetic properties have linear relation of which a coefficient of determination with the direct current value is 0.9 or more, an ingot growing container can be selected for the direct current value flowing in an ingot growing container to have a similar value when an ingot grows. Additionally, when an ingot is allowed to grow through the ingot growing container considering different properties (weight, etc.) of the ingot growing container, growth rate trend of the ingot can be predicted, so that reproducibility of growth of an ingot can be secured.

The electromagnetic properties may be specifically one or more selected from the group consisting of equivalent series resistance, equivalent series inductance, and quality factor. Generally, the equivalent series resistance or equivalent series inductance is a factor used for property measurement of a circuit comprising a capacitor or an inductor, but in example embodiments, the factor is applied for measuring electromagnetic properties of a coil in which an ingot growing container is accommodated, thereby measuring electromagnetic properties of the ingot growing container.

The coil 10 may comprise withdrawal wires 12a, 12b withdrawn to the outside, and each withdrawal wire may be connected electronically to the means of measurement 300. the withdrawal wire may correspond to both ends of a conducting wire when the conducting wire is winded.

The coil 10 may comprise accommodation space 13 located in the internal. The accommodation space may have a length (width) of 100 mm or more, and of 300 mm or less, but the length is not limited thereto if the ingot growing container is allowed to be accommodated and induced electromotive force can be applied in that length. When a conducting wire of the coil is winded in the shape of a circle, the accommodation space 13 may have a shape corresponding to the bottom or the top of the ingot growing container, and may have a circle shape.

The inside of the coil 10 may be arranged toward the ingot growing container 200, and may be arranged in a distance in which a current can be induced to the ingot growing container when power for measurement is applied to the coil. Specifically, an ingot growing container may be arranged in empty accommodation space 13 inside the coil, and the coil and ingot growing container may be in state of separation in a fixed interval, like examples illustrated in FIG. 5 and FIG. 6. That is, the ingot growing container may be arranged in a range affected by induced electromotive force to be induced to AC power for measurement applied in the coil, and may be arranged to satisfy relation having the coefficient of determination of 0.9 or more between the electromagnetic properties and a direct current value flowing in an ingot growing container when the ingot growing container is heated through an induction heating means, or between the electromagnetic properties and a factor relating to the direct current value.

Like FIG. 5, the section (AA') of the coil 10 may have a thickness in x direction (Tx) measured in x direction which is horizontal to the bottom or the top of the ingot growing container 200, and a thickness in z direction (Tz) measured in z direction which is perpendicular to the x direction. At this time, the coil may have a flat spiral coil shape in which the greatest thickness in the x direction is the same with or greater than the thickness in the z direction.

The thickness in x direction of the coil 10 may be a direction diverging horizontally to a cross-section of an ingot growing container to the external of an ingot growing container accommodated inside the coil.

When the coil 10 has the flat spiral coil shape, a thickness in x direction (Tx) may be eight times or more, or ten times or more with respect to the thickness in z direction (Tz). The thickness in x direction may be forty-five times or less, or forty times or less with respect to the thickness in z direction. In addition, the number of winding of the conducting wire in the coil may be five times or more comprising an initial winded conducting wire 11, and may be forty-five times or less. In a range satisfying the thickness in x and z directions, and the number of winding, loss of a conducting wire and degradation of the coefficient of determination can be prevented, so that a more reliably measured result of electromagnetic properties can be obtained.

When the coil 10 has the flat spiral coil shape, the inner circumference surface of the coil may meet the side of the ingot growing container 200, and may also have a fixed interval with the side. The shape of a winded conducting wire of the coil may be the same substantially with the shape of the side of the ingot growing container.

When the coil 10 has the flat spiral coil shape, a flat spiral coil with one-layer may be prepared and the height may be the same with the thickness of the conducting wire. The flat spiral coil with one-layer may be prepared by winding following conducting wires successively, along the outer circumference surface of one initial winded conducting wire 11, and the one initial winded conducting wire and following conducting wires may be located on the same plane. Even when the conducting wires are winded in one layer on the same plane, some deviation in the height may be generated.

When the coil 10 has the flat spiral coil shape, a flat spiral coil in which conducting wires are winded successively on the flat spiral coil with one layer may be laminated, or irregularly winded coils not having a flat spiral coil shape may be laminated.

When the coil 10 has the flat spiral coil shape, the cross-section of the center may be arranged to be horizontal to the cross-section of the ingot growing container 200. At this time, the center of the coil may be arranged in the highest portion or the lowest portion of the ingot growing container, but the location is not limited thereto if electromagnetic properties are induced to the coil in the location.

In addition, like FIG. 6, the section (BB') of the coil may have a thickness in x direction (Tx) measured in x direction which is horizontal to the bottom or the top of the ingot growing container 200, and a thickness in z direction (Tz) measured in z direction which is perpendicular to the x direction. At this time, the coil in the aircore coil shape may have the thickness in z direction which is larger than the thickness in x direction.

When the coil 10 has the aircore coil shape, the inner circumference surface of the coil may be arranged to meet the side 210 of the ingot growing container 200, and may be arranged to be accommodated inside the coil, having a fixed interval with the ingot growing container.

When the coil 10 has the aircore coil shape, the shape of the inner circumference surface of the coil may be corresponded with the shape of the side 210 of the ingot growing container.

When the coil 10 has the aircore coil shape, the thickness in x direction (Tx) may be the direction diverging horizontally to a cross-section of an ingot growing container to the external of an ingot growing container accommodated inside the coil.

When the coil 10 has the aircore coil shape, the thickness in z direction (Tx) may be five times or more, or ten times or more with respect to the thickness in x direction. The thickness in z direction may be fifty times or less, or forty times or less with respect to the thickness in x direction. In addition, the number of winding of the conducting wire in the coil may be fifty times or less, forty-five times or less, or forty times or less. The reliability for measurement of the electromagnetic properties can be increased, loss of conducting wire can be minimized, and the coefficient can be 0.9 or more, by the coil having the above range of the thickness and the number of winding.

The conducting wire of the coil 10 may be prepared by covering a line formed by twisting a wire of 50 strands or more, and 2000 strands or less, and the wire may also be one covered. For example, the conducting wire may be a litz wire. The diameter of the wire may be 0.05 mm or more, or 0.08 mm or more. The diameter of the wire may be 0.2 mm or less, or 0.125 mm or less. When the wire has the above range of strands and diameter, a process for manufacturing a conducting wire can be simplified, and energy loss caused from skin effect can be minimized.

The diameter of the conducting wire may be different depending on the perimeter of the ingot growing container, the diameter of the wire, and the number of strands.

The ingot growing container 200 may have a cross-section in the shape of a fixed cask, may have an outer diameter (Do) in the fixed shape, and may comprise internal space with having an outer diameter (Do) and an inner diameter, wherein the upper portion may have an opened shape.

The side of the ingot growing container 200 may have a perimeter length, and the perimeter length (mm) and the sectional area (mm$^2$) of conducting wires of the coil 10 may have a ratio of 100:1.57 to 161, or of 100:2.35 to 121. The sectional area of conducting wires of the coil refers to the sum of conducting wires excepting the cover from each sectional area of conducting wires consisting the coil, like an example illustrated in FIG. 5 and FIG. 6, and may be the sum of sectional areas of the conducting wires in the area of a certain side toward the outside from the center of the coil. In addition, the perimeter of the side (mm) of the ingot growing container and the thickness of the conducting wire (mm) may have a ratio of 100:0.194 to 1.09, or 100:0.291 to 0.82. The purposed electromagnetic properties of the ingot growing container can be measured easily in the above range of ratio, and linear relation of which the coefficient determination ($R^2$) between the measured electromagnetic properties and the direct current value is 0.9 or more can be achieved.

The ingot growing container 200 may be a graphite crucible for growth of an ingot, and may be a silicon carbide graphite crucible for growth of an ingot.

The means of measurement 300 may apply AC power having described frequency and voltage to the coil inside which an ingot growing container is accommodated, and may measure equivalent series resistance, equivalent series inductance, quality factor induced when the AC power is applied. The means of measurement may be specifically an LCR meter.

Figure 7:
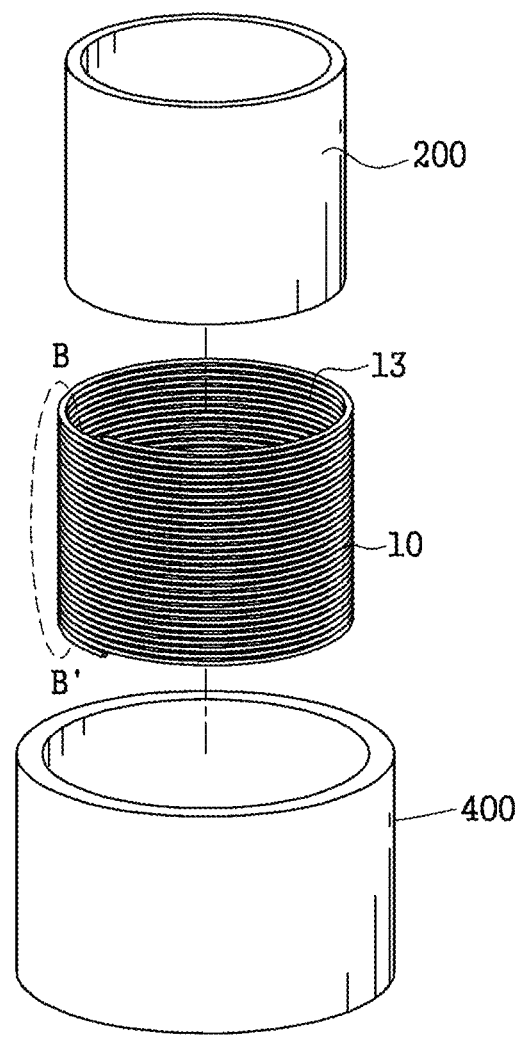
FIG. 7 is a perspective view showing arrangement of a coil, an insulating material, and an ingot growing container according to one or more examples.
Figure 8:
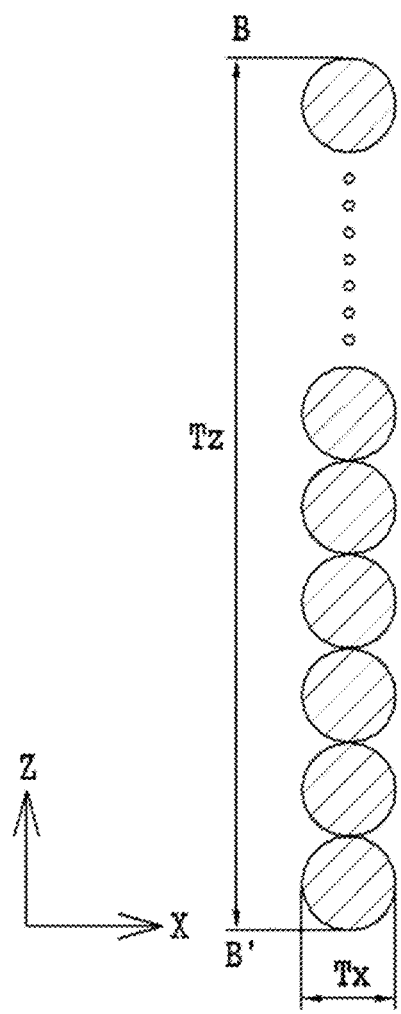
FIG. 8 is a partial enlarged view showing the enlarged section (BB') of the coil in FIG.
Figure 9:
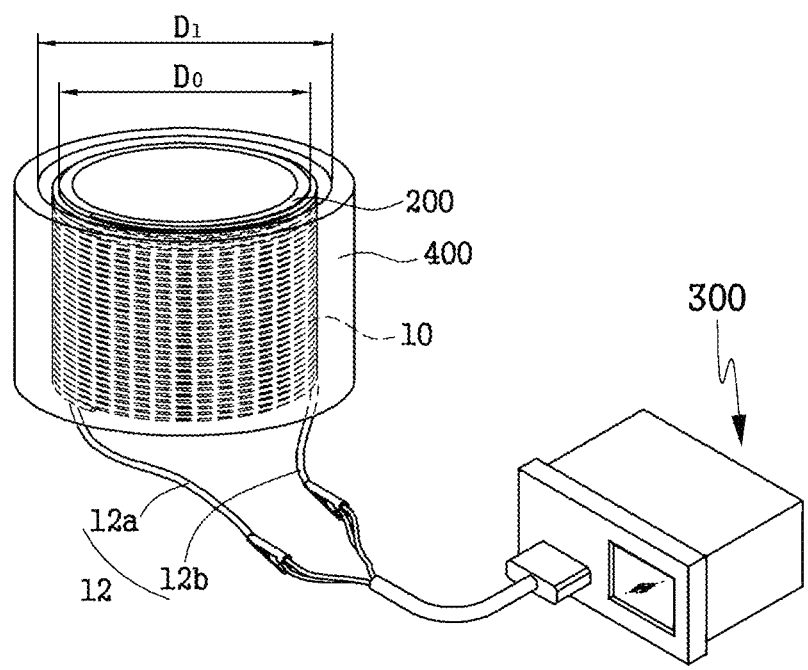
FIG. 9 is a perspective view showing an apparatus for measurement of an insulating material according to one or more examples.
Figure 10:
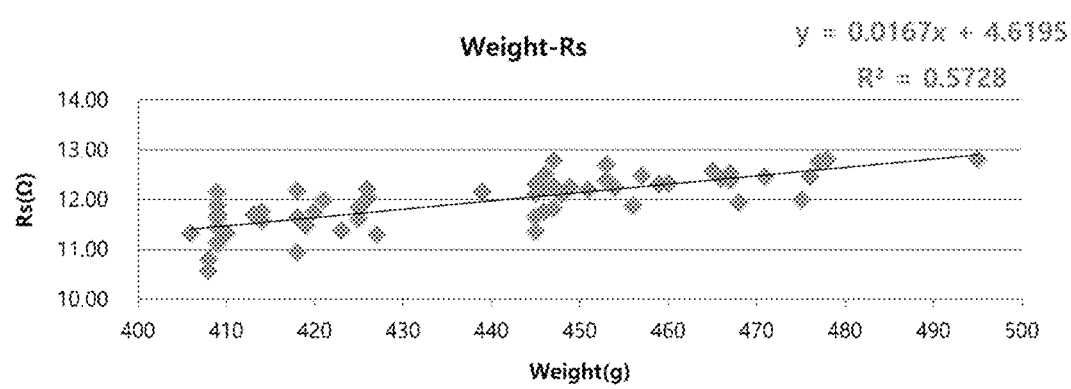
FIG. 10 is a graph showing relation of a value of equivalent series resistance of an insulating material and the weight of the insulating material measured in one or more examples and comparative examples.
Figure 11:
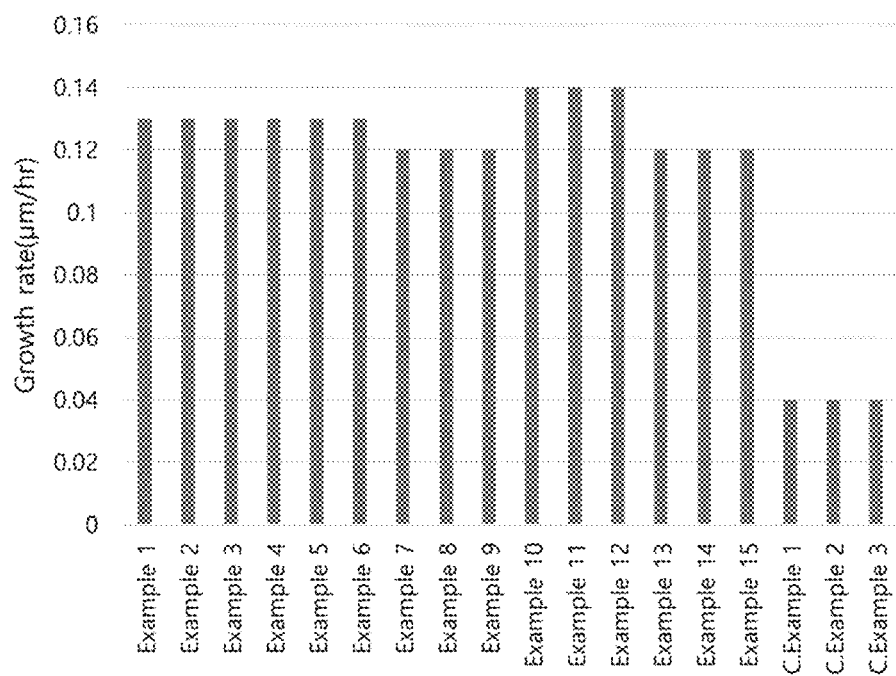
FIG. 11 is a graph showing an average growth rate when a silicon carbide ingot is allowed to grow through an insulating material in one or more examples and comparative examples.

FIG. 7 is a perspective view showing arrangement of a coil, an insulating material, and an ingot growing container according to one or more examples. FIG. 8 is a partial enlarged view showing the enlarged section (BB') of the coil in FIG. 7. FIG. 9 is a perspective view showing an apparatus for measurement of an insulating material according to one or more examples. FIG. 10 is a graph showing relation of a value of equivalent series resistance of an insulating material and the weight of the insulating material measured in one or more examples and comparative examples. FIG. 11 is a graph showing an average growth rate when a silicon carbide ingot is allowed to grow through an insulating material in one or more examples and comparative examples.

Hereinafter, example embodiments will be described in more detail, with an insulating material as exemplification of a graphite article, referring to the drawings.

An apparatus for measuring an insulating material comprises a coil 10 comprising a winded conducting wire; and a means of measurement 300 connected electronically to the coil, wherein the means of measurement applies power for measurement to the coil thereby measuring electromagnetic properties of an insulating material 400.

The electromagnetic properties may be a factor relating to variation of induced electromotive force generated in the coil 10 by the insulating material. Induced electromotive force refers to electromotive force generated from variation of magnetic flux, and when the power for measurement applied to the coil is AC power, an induced current is formed in the ingot growing container by alternating magnetic field to be generated, and thereby induced electromotive force may be applied to a coil.

The electromagnetic properties may also be a factor proportional to resistance of the insulating material 400.

The electromagnetic properties may be induced, when power for measurement having specific frequency and voltage applied to the coil 10 through the means of measurement 300.

At this time, the insulating material 400 may be located in the external of the coil. The coil may be located in the outer surface of a holder, and adumbratively the holder may be a heat-insulated object 200. When an apparatus for measuring an insulating material applied with a heat-insulated object as the holder is applied, electromagnetic properties of an insulating material when arranged with a real heat-insulated object can be checked more easily.

The frequency of the AC power for measurement may be 1 mHz to 200 kHz, or may be 10 Hz to 100 kHz. The voltage of the AC power for measurement may be 5 mV to 5 V, or may be 10 mV to 5 V. The purposed electromagnetic properties can be induced effectively to occur in the coil in the above range of the frequency and voltage.

The electromagnetic properties may be specifically one or more selected from the group consisting of equivalent series resistance, equivalent series inductance, and quality factor. Generally, the equivalent series resistance or equivalent series inductance is a factor used for property measurement of a circuit comprising a capacitor or an inductor, but in example embodiments, the factor is applied for measuring electromagnetic properties of a coil arranged to adjoin an insulating material 400, thereby checking electromagnetic properties of the insulating material more quickly and significantly.

The coil 10 may comprise withdrawal wires 12a, 12b withdrawn to the external, and each withdrawal wire may be connected electronically to the means of measurement 300. the withdrawal wire may correspond to both ends of a conducting wire when the conducting wire is winded.

The coil 10 may comprise accommodation space 13 located in the internal. The accommodation space may have a length (width) of 100 mm or more, and of 300 mm or less, but the length is not limited thereto if the heat-insulated object 200 is corresponded and induced electromotive force can be applied in that length. The conducting wire of the coil may be winded to have a cross-section of accommodated space in the shape of a circle, and the accommodation space 13 may have a cylinder shape having a size suitable for accommodating the heat-insulated object.

The coil 10 may comprise arrangement space (not shown in drawings) located in the external. The arrangement space is space in which the insulating material is located. The insulating material formed in a fixed shape may be arranged in the arrangement space, and the size or shape is not limited if being in a range affected by induced electromotive force. When the insulating material is applied for growth of an ingot, the insulating material may have a shape surrounding the body of a crucible which is a heat-insulated object, and adumbratively may have a cylinder shape. When the conducting wire of the coil is winded in a circle shape, the arrangement space may have a shape corresponding to the external surface of the coil or the internal surface of the insulating material, and adumbratively may have a cylinder shape.

The coil 10 may be arranged to locate side-by-side with one side of the insulating material 400. For example, the coil may be located side-by-side with a side of an insulating material, and may be located side-by-side with the bottom or the top of the insulating material.

The insulating material may be arranged in a distance in which a current can be induced when power for measurement is applied to the coil. Specifically, a heat-insulated object 200 may be located in empty accommodation space 13 of the internal of the coil, and the insulating material may be located with a fixed interval in the external of the coil. That is, the insulating material may be arranged within a range affected by induced electromotive force which is induced by AC power for measurement applied to the coil.

The section (BB') of the coil 10 may have a thickness in x direction (Tx) measured in x direction which is horizontal to the bottom or the top of the insulating material 400, and a thickness in z direction (Tz) measured in z direction, which is perpendicular to the x direction, like examples in FIG. 7 and FIG. 8. At this time, the coil may have an aircore coil shape in which the thickness in z direction is greater than the thickness in x direction.

The coil 10 may be arranged to have an inner circumference surface meeting a side of the heat-insulated object 200, and may be arranged in the interval between the heat-insulated object and the insulating material 400.

The shape of the inner circumference surface 13 of the coil 10 may correspond to the shape of the side of the heat-insulated object 200.

The thickness in x direction (Tx) of the coil 10 may be a direction diverging horizontally to a cross-section to the external of an insulating material 400.

The thickness in z direction (Tz) of the coil 10 may be five times or more, or ten times or more with respect to the thickness in x direction (Tx). The thickness in z direction may be fifty times or less, or forty times or less. In addition, the number of winding of the conducting wire of the coil may be ten times or more, twelve times or more, or fifteen times or more. The number of winding of the conducting wire of the coil may be fifty times or less, forty-five times or less, or forty times or less. The reliability for measurement of the electromagnetic properties can be increased, and loss of conducting wire can be minimized, by the coil having the above range of the thickness and the number of winding.

The conducting wire or the coil 10 may be prepared by covering a line formed by twisting a wire of 50 strands or more, and 2000 strands or less, and the wire may also be one covered.

For example, the conducting wire may be a litz wire. The diameter of the wire may be 0.05 mm or more, or 0.08 mm or more. The diameter of the wire may be 0.2 mm or less, or 0.125 mm or less. When the wire has the above range of strands and diameter, a process for manufacturing a conducting wire can be simplified, and energy loss caused from skin effect can be minimized.

The diameter of the conducting wire may be different depending on the perimeter of the heat-insulated object 200 and the insulating material 400, the diameter and the number of strands of the wire.

The heat-insulated object 200 may have a cross-section in the shape of a fixed cask, may have an outer diameter (Do) in the fixed shape, and may comprise internal space with having an outer diameter and an inner diameter, wherein the upper portion may have an opened shape.

The insulating material 400 may have a cross-section in the shape of a fixed cask, may have an inner diameter (Di) in the fixed shape, and may comprise internal space with having an outer diameter and an inner diameter, wherein the upper portion and the lower portion may have an opened shape. The heat-insulated object 200 may be arranged in the internal space of the insulating material, and the insulating material and the heat-insulated object 200 may have a fixed interval therebetween.

The heat-insulated object 200, for example, may be heated by an external heating means, and may be an ingot growing container which may be heated by an induction heating means. The heat-insulated object may be a graphite crucible for growth of an ingot, and may be a graphite crucible for growth of a silicon carbide ingot.

The insulating material 400 may comprise a carbon-based felt, for example, may comprise a graphite felt, and may comprise a rayon-based graphite felt, or a pitch-based graphite felt.

The insulating material 400 may applied in an ingot growing apparatus for growth of a silicon carbide ingot. For example, the insulating material may applied to an ingot growing apparatus comprising an ingot growing container 200 having internal space; an insulating material 400 arranged in the external of the ingot growing container and surrounding the ingot growing container; a heating means controlling the temperature of the ingot growing container; a reacting chamber comprising the ingot growing container surrounded with the insulating material in the internal; a vacuum exhauster connected to the internal of the reacting chamber and adjusting the degree of vacuum inside the reacting chamber; a pipe connected to the internal of the reacting chamber and allowing gas to flow into the internal of the reacting chamber; and a mass flow controller controlling inflow of the gas.

The means of measurement 300 may applies AC power of a described frequency and voltage to a coil comprising a heat-insulated object 200 located in the internal and an insulating material 400 located in the external, and may measure equivalent series resistance, equivalent series inductance, quality factor induced when the AC power is applied. The means of measurement, for example, may be an LCR meter.

An insulating material having similar electromagnetic properties is allowed to be selected, with other means of measurement such as weight and so on, or separately, by utilizing a value of electromagnetic properties measured through the means of measurement 300, and this is applied as an insulating material of an ingot growing container thereby securing reproducibility when an ingot grows.

Method of Measurement

A method according to one or more examples, measure properties relating to an induction heating characteristic of a graphite article, comprising an arranging step of arranging a graphite article to a coil comprising a winded conducting wire; and a measuring step of applying power for measurement to the coil through a means of measurement connected electronically to the coil, and measuring electromagnetic properties induced to the coil.

As for exemplification of a method of measurement, a method of measuring an ingot growing container and a method of measuring an insulating material will be described, respectively.

A method of measuring an ingot growing container according to one or more examples, comprises an arranging step of arranging an ingot growing container to a coil comprising a winded conducting wire; and a measuring step of applying power for measurement to the coil through means of measurement connected electronically to the coil, and measuring electromagnetic properties induced to the coil.

The arranging step is a step of arranging an ingot growing container which is a measured object.

In the arranging step, the coil may be arranged for the internal to direct the ingot growing container, and may be arranged in a distance suitable for inducing a current to the ingot growing container when AC power for measurement is applied to the coil. Specifically, an ingot growing container may be arranged to be accommodated in empty accommodation space inside the coil, and the coil and ingot growing container may be arranged to be separated in a fixed interval, like examples illustrated in FIG. 5 and FIG. 6. That is, the ingot growing container may be arranged in a range affected by induced electromotive force induced by AC power for measurement applied to the coil, and may be arranged to satisfying relation in which the coefficient of determination between the electromagnetic properties and a direct current value flowing in an ingot growing container when the ingot growing container is heated through an induction heating means or a factor relating to the same is 0.9 or more.

The coil is the same with the above description.

When the coil has a flat spiral coil shape, the inner circumference surface of the coil may meet the side of the ingot growing container, and may have a fixed interval with the side.

When the coil has an aircore coil shape, the inner circumference surface of the coil may meet the side of the ingot growing container, and may be allowed to arranged in accommodation space inside a coil, having a fixed interval with the side.

An ingot growing container and relation thereof with a coil are the same with the above description.

The measuring step is a step of applying AC power of specific frequency and voltage, through a means of measurement connected electronically to the coil, and measuring electromagnetic properties induced to the coil.

The electromagnetic properties in the measuring step may comprise a factor relating to variation of induced electromotive force generated in the coil by the ingot growing container or a factor relating to resistance of the ingot growing container, and are the same with the description.

The electromagnetic properties in the measuring step may have linear relation with a direct current value when the ingot growing container is heated by an induction heating means to which power having specific frequency and voltage is added, or a factor relating to the same wherein the coefficient of determination ($R^2$) is 0.9 or more, and are the same with the description.

The condition of AC power for measurement in the measuring step may be the same with the description.

A method of measuring an insulating material according to one or more examples, comprises an arranging step of arranging an insulating material 400 to adjoin a coil 10 comprising a winded conducting wire; and a measuring step of applying power for measurement through a means of measurement 300 connected electronically to the coil, and measuring electromagnetic properties induced to the coil.

The arranging step is a step of arranging an insulating material 400 which is a measured object to the coil 10. In the arranging step the insulating material 400 may be allowed to be located in the external of the coil with a fixed interval. In the arranging step a heat-insulated object 200 may also be allowed to be located in the internal of the coil.

The coil 10 in the arranging step may be arranged in a distance in which a current can be induced to the insulating material 400 when AC power for measurement is applied. Specifically, the insulating material 400 may be allowed to be located in the external of the coil. In concurrence with this, the heat-insulated object 200 may be arranged to be accommodated in empty accommodation space 13 inside the coil, or may be not arranged.

Characteristics of a coil 10 in the arranging step are the same with the above description. When the coil 10 has an aircore coil shape, the inner circumference surface 13 of the coil may meet the side of the heat-insulated object 200, and may be allowed to be arranged in accommodation space 13 inside a coil having a fixed interval with the side. And the insulating material 400 may be allowed to be arranged in the external of a coil having a fixed interval with the outer circumference surface of the coil.

Characteristics of a heat-insulated object 200 and an insulating material 400 in the arranging step are the same with the above description.

The measuring step is a step of applying AC power for measurement in specific frequency and voltage, through a means of measurement 300 connected electronically to the coil 10, and measuring electromagnetic properties induced to the coil. Specifically, the frequency of AC power for measurement in the measuring step may be 1 mHz to 200 kHz, or may be 10 Hz to 100 kHz. The voltage of AC power for measurement may be 5 mV to 5 V, or may be 10 my to 5 V. The purposed electromagnetic properties can be induced effectively to occur in the coil in the above range of the frequency and voltage.

The electromagnetic properties in the measuring step may comprise a factor relating to variation of induced electromotive force generated by the insulating material 400 or a factor proportional to resistance of the insulating material, and this is the same with the above description.

The condition of AC power for measurement in the measuring step may be the same with the above description.

Ingot Growing Container

An ingot growing container 200 comprises a graphite, and may have a value of equivalent series resistance of 1.5Ω to 7.3Ω measured by applying AC power of 100 kHz and 0.1 A to an ingot growing container in a flat spiral coil shape 100a.

The apparatus for measuring an ingot growing container in the flat spiral coil shape 100a may be an apparatus for measuring an ingot growing container comprising a coil 10 in the flat spiral coil shape, like the description.

The section (AA') of the coil 10 in the flat spiral coil shape may have a thickness in x direction (Tx) measured in x direction which is horizontal to the bottom or the top of the ingot growing container 200, and a thickness in z direction (Tz) measured in z direction which is the side direction of the ingot growing container and perpendicular to the x direction, like an example illustrated in FIG. 5. At this time, the coil may have the maximum thickness of x direction which is the same or greater than the thickness in z direction. Specifically, the ratio of the thickness in x direction to the thickness in z direction of the coil may be 1:14, and the number of winding may be fourteen times. A conducting wire consisting the coil may be a litz wire having a diameter of 3.5 mm in which a wire of 750 strands having a diameter of 0.1 mm is twisted and covered.

The ingot growing container 200 may have a cross-section in the shape of a fixed cask, may have an outer diameter (Do) in the fixed shape, and may comprise internal space with having an outer diameter (Do) and an inner diameter, wherein the upper portion may be opened, like examples illustrated in FIG. 1 and FIG. 2.

The outer diameter of the ingot growing container 200 may be the same with the perimeter length of the inner diameter, substantially. In this case, accuracy of measurement can be more improved.

When the outer diameter (Do) of the ingot growing container 200 is 200 mm to 220 mm, and the thickness in a direction from the outer diameter to the inner diameter is 10 mm to 30 mm, in the state of being accommodated with adjoining the internal of a coil 10, the ingot growing container may have a value of equivalent series resistance (Rs) of 2.25Ω to 4.56Ω, of 2.7Ω to 4.02Ω, or of 2.99Ω to 3.65Ω measured by the apparatus for measuring an ingot growing container in the flat spiral coil shape. In addition, the value of equivalent series inductance (Ls) measured by the apparatus for measuring an ingot growing container in the flat spiral coil shape may be 27.44 pH to 47.83 pH, may be 32.93 pH to 42.09 pH, or may be 36.59 pH to 38.26 μH. The measured value of equivalent series resistance or equivalent series inductance and a value of direct current flowing in an ingot growing container when the ingot growing container is heated or a factor relating to the same may have linear relation of which the coefficient of determination ($R^2$) is 0.9 or more. Thereby, the measured ingot growing container may be selected to show a similar direct current value when an ingot grows depending on the value of measured result.

In addition, an ingot growing container 200 according to one or more examples, comprises a graphite, and may have a value of equivalent series resistance of 3.50Ω to 7.24Ω measured by applying AC power of 100 kHz an 0.1 A to an apparatus for measuring an ingot growing container in the aircore coil shape 100b.

The apparatus for measuring an ingot growing container in the flat spiral coil shape 100b may be an apparatus for measuring an ingot growing container comprising a coil 10 in the flat spiral coil shape, like the description.

The section (BB') of the coil 10 in the aircore coil shape may have a thickness in x direction (Tx) measured in x direction which is horizontal to the bottom or the top of the ingot growing container 200, and a thickness in z direction (Tz) measured in z direction which is the side direction of the ingot growing container and perpendicular to the x direction. At this time, the thickness in z direction may be greater than the thickness in x direction. Specifically, the ratio of the thickness in z direction to the thickness in x direction may be 1:27, and the number of winding may be twenty-seven times. The conducting wire consisting the coil may be a litz wire having a diameter of 3.5 mm in which a wire of 750 strands having a diameter of 0.1 mm is twisted and covered.

The specific shape of the ingot growing container 200 is the same with the description. The outer diameter of the ingot growing container 200 may be the same with the perimeter of the inner diameter of the coil, substantially. In this case, accuracy of measurement can be more improved.

When the outer diameter (Do) of the ingot growing container 200 is 200 mm to 220 mm, and the thickness in a direction from the outer diameter to the inner diameter is 10 mm to 30 mm, in the state of being accommodated with adjoining the internal of a coil 10 the ingot growing container may have a value of equivalent series resistance (Rs) of 3.50Ω to 7.24Ω, of 4.19Ω to 6.37Ω, or of 4.65Ω to 5.79Ω measured by the apparatus for measuring an ingot growing container in the flat spiral coil shape. In addition, the value of equivalent series inductance (Ls) measured by the apparatus for measuring an ingot growing container in the flat spiral coil shape may be 74.42 pH to 120.6 pH, may be 89.30 pH to 111.67 pH, or may be 99.22 pH to 101.52 pH. The value of equivalent series resistance or equivalent series inductance and a value of direct current flowing in an ingot growing container when the ingot growing container is heated by an induction heating means or a factor relating to the same may have linear relation of which the coefficient of determination ($R^2$) is 0.9 or more. Thereby, the measured ingot growing container may be selected to show a similar direct current value when an ingot grows depending on the value of measured result.

Insulating Material

An insulating material for growth of an ingot according to one or more examples, comprises an insulating material 400 in a cylinder shape corresponding to the shape of the outer surface of the ingot growing container with surrounding the outer surface of an ingot growing container; and may have a value of equivalent series resistance of 10.57Ω to 14.16Ω measured by applying AC power of 100 kHz and 0.1 A to the apparatus for measuring an insulating material according to the above description.

The apparatus for measuring an insulating material may be an apparatus for measuring an insulating material comprising a coil 10 in the aircore coil shape like the above description.

The section (BB') of the coil 10 in the aircore coil shape may have a thickness in x direction (Tx) measured in x direction which is horizontal to the bottom or the top of the insulating material 400, and a thickness in z direction (Tz) measured in z direction which is the side direction of the insulating material and perpendicular to the x direction. At this time, the thickness in z direction may be greater than the thickness in x direction. Specifically, the ratio of the thickness in z direction to the thickness in x direction may be 1:27, and the number of winding may be twenty-seven times. The conducting wire consisting the coil may be a litz wire having a diameter of 3.5 mm in which a wire of 750 strands having a diameter of 0.1 mm is twisted and covered.

The specific shape of the ingot growing container 200 and insulating material 400 is the same with the above description.

When the inner diameter (Do) of the ingot growing container 200 is 150 mm to 180 mm, and the thickness in a direction from the outer diameter to the inner diameter is 10 mm to 30 mm, in a state of an insulating material being located in the external of the coil and in a state of the ingot growing container being accommodated with adjoining the internal of a coil 10, a value of equivalent series resistance (Rs) of 10.57Ω to 14.16Ω, or of 11.95Ω to 12.87Ω measured by applying AC power of 100 kHz and 0.1 A using the apparatus for measuring an insulating material.

Ingot Growing System

Figure 12:
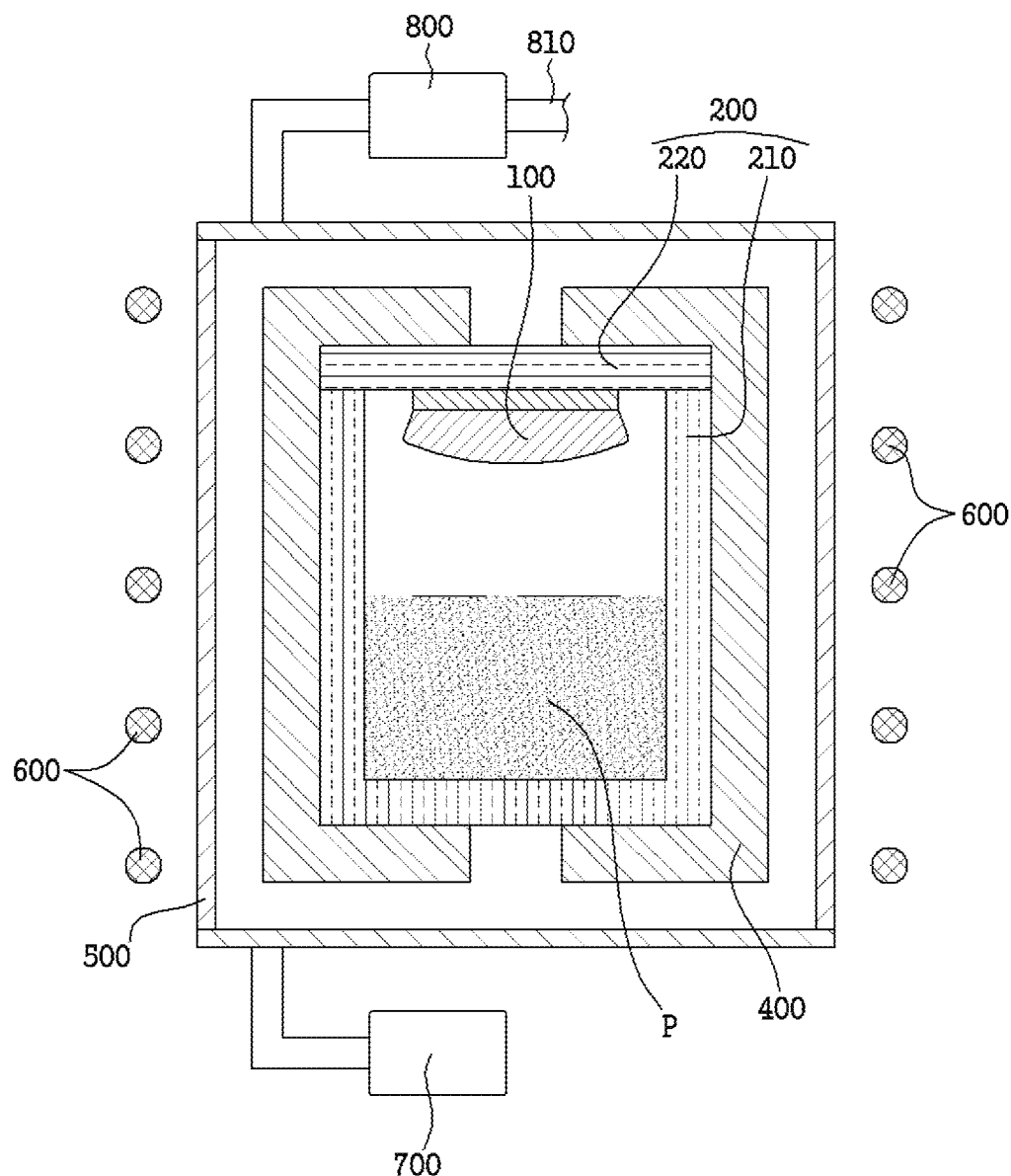
FIG. 12 is a conceptual view illustrating a structure of an ingot growing apparatus (growing portion) with a section.
Figure 13:
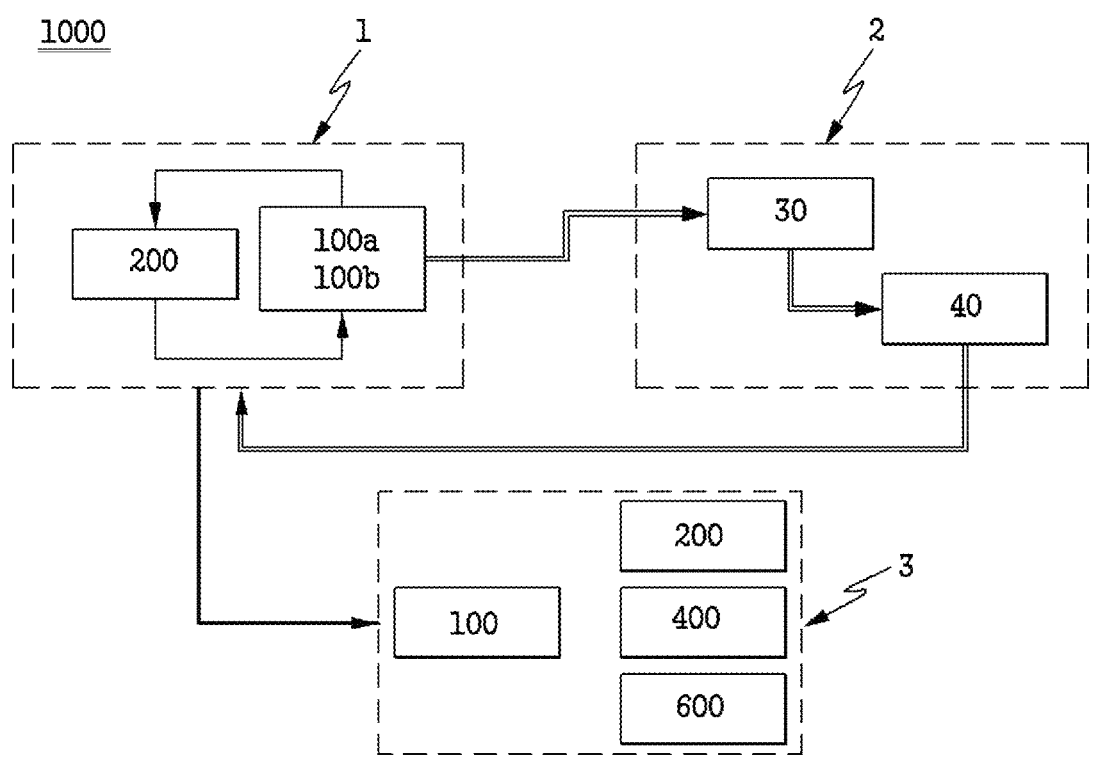
FIG. 13 is a block diagram expressing a structure of an ingot growing system and measurement of electromagnetic properties (thin solid line), the flow of data (double solid line), and movement of a real ingot growing container (thick solid line).

FIG. 12 is a conceptual view illustrating a structure of an ingot growing apparatus (growing portion) with a section. FIG. 13 is a block diagram expressing a structure of an ingot growing system and measurement of electromagnetic properties (thin solid line), the flow of data (double solid line), and movement of a real ingot growing container (thick solid line). Referring to the drawings, an ingot growing system will be described in more detail.

An ingot growing system according to example embodiments is a system for a silicon carbide ingot to grow comprising a graphite article and a heating means. The ingot growing container comprises a body having internal space in which materials are arranged; and a silicon carbide seed arranged in the upper portion of the body or the body. The graphite article is an ingot growing container or an insulating material, and has a value of equivalent series resistance which is a value of electromagnetic properties measured by an apparatus for measurement.

The ingot growing container may have a value of equivalent series resistance of 3.50Ω to 7.24Ω measured by applying AC power of 100 kHz and 0.1 A. The value is based on the value measured with an apparatus for measurement in the aircore coil shape.

The insulating material may have a value of equivalent series resistance of 10.57Ω to 14.16Ω measured by applying AC power of 100 kHz and 0.1 A. The value is based on the value measured using an apparatus for measurement in the aircore coil shape in a state of having an ingot growing container arranged in the internal of a coil and an insulating material arranged in the external of a coil.

The silicon carbide ingot may be induced to grow in a rate of 100 mm/hr or more. An ingot growing system 1000 according to one or more examples comprises a measurer 1 measuring indirect properties and the like of an ingot growing container, a predictor 2 in which information obtained from the measurer is calculated and displayed, and a grower 3 allowing an ingot to grow using an ingot growing container having a value of predicted result. The measurer may further measure the weight of an ingot growing container and so on.

The measurer 1 comprises an ingot growing container 200 and an apparatus for measuring an ingot growing container 100*a*, 100*b*, and they may give and take electromagnetic signals from each other.

The predictor 2 comprises a calculator 30 and an output device 40 displaying the calculated result. A calculator is applicable without a limit if save and calculation of data are possible with it, and an output device is applicable without a limit if a value of output can be displayed with it. For example, a computer and a monitor may be applied. The predictor can convert electromagnetic properties measured in the measurer into a value of resistance of an ingot growing container or an insulating material which is direct properties, and can predict the growth rate of an ingot and the like. The converting refers to a calculation presenting direct properties corresponding to electromagnetic properties measured in a measurer and weight accumulated in a database. The predicting refers to a calculation proceeding depending on Equation 1 and Equation 2 below, when direct properties corresponding to electromagnetic properties measured in a measurer and weight accumulated in a database.

The grower 3 allows an ingot 100 to grow comprising an ingot growing container 200 and a heating means 600.

The heating means induces the internal space to be in atmosphere for growth of a crystal, thereby fostering atmosphere for growth of a crystal for the material (P) to be transferred with steam to the seed and to be deposited for preparation of an ingot growing from the seed, and induces growth of an ingot.

The ingot growing container 200 comprises a body 210 having internal space in which a material (P) is arranged; and a seed arranged in upper portion of the body or in the body.

The seed may be held by a cover 220.

The ingot growing container or the body have a value of electromagnetic indirect properties checked by applying AC power which is power for measurement, and the value of indirect properties have high correlation with direct properties.

The value of electromagnetic indirect properties comprise a value of equivalent series resistance, and the value of equivalent series resistance has correlation in which coefficient of determination with a value of direct current flowing in an ingot growing container when the ingot growing container is heated with the heating means is 0.9 or more.

The value of equivalent series resistance is checked with an apparatus for measuring an ingot growing container, and a coil comprising a winded wire is arranged in the ingot growing container.

Properties like a growth rate may also be predicted with a Pr value according to Equation 1 or a Pl value according to Equation 2 below which is calculating weight and indirect properties of the ingot growing container measured by an apparatus for measuring an ingot growing container in a flat spiral coil shape.

$$Pr = \frac{\text{Equivalent Series Resistance }[\Omega]}{\text{Weight [g]}} \times 10^4 \quad \text{[Equation 1]}$$

$$Pl = \frac{\text{Equivalent Series Inductance }[uH]}{\text{Weight [g]}} \times 10^4 \quad \text{[Equation 2]}$$

Specifically, when a Pr value according to Equation 1 is 6.05 or less, or a Pl value according to Equation 2 is 7.2 or less, an excellent growth rate of an ingot can be achieved. Adumbratively, a growth rate of an ingot of about 100 mm/hr or more can be shown.

The Pr value may be 6.0 or less. The Pr value may be 5.8 or less. The Pr value may be 5.7 or less. The Pr value may be 4.8 or more. The Pr value may be 5.1 or more.

The Pl value may be 7.0 or less. The Pl value may be 6.8 or less. The Pl value may be 6.0 or more. the Pl value may be 6.2 or more. The Pl value may be 6.5 or more. The Pl value may be 6.5 to 6.7.

In these cases, a more excellent growth rate of an ingot can be achieved, and adumbratively the growth rate of an ingot may be 110 to 130 mm/hr, or more.

Thereby, the measured ingot growing container induces growth of an ingot with an ingot growing container having advantaged characteristics for growth of an ingot depending on a value of measured result, so that more efficient manufacture of an ingot can be enabled.

Properties like a growth rate may also be predicted with a Pr value according to Equation 1 or a Pl value according to Equation 2 below which is calculating weight and indirect properties of the ingot growing container measured by an apparatus for measuring an ingot growing container in the aircore coil shape.

$$Pr = \frac{\text{Equivalent Series Resistance }[\Omega]}{\text{Weight [g]}} \times 10^4 \quad \text{[Equation 1]}$$

$$Pl = \frac{\text{Equivalent Series Inductance }[uH]}{\text{Weight [g]}} \times 10^4 \quad \text{[Equation 2]}$$

Specifically, when a Pr value according to Equation 1 is 9.46 or less, or a Pl value according to Equation 2 is 18.5 or less, an excellent growth rate of an ingot can be achieved. Adumbratively, a growth rate of an ingot of about 100 mm/hr or more can be shown.

The Pr value may be 8.91 or less. The Pr value may be 8.42 or less. The Pr value may be 8.30 or less. The Pr value may be 7.0 or more. The Pr value may be 8.0 or more.

The Pl value may be 18.1 or less. The Pl value may be 16.8 or more. The Pl valued may be 17.1 or more. The Pl value may be 17.3 or more. The Pl value may be 17.4 to 18.1.

In these cases, a more excellent growth rate of an ingot can be achieved, and adumbratively the growth rate of an ingot may be 110 to 130 mm/hr, or more.

Thereby, the measured ingot growing container induces growth of an ingot with an ingot growing container having advantaged characteristics for growth of an ingot depending on a value of measured result, so that more efficient manufacture of an ingot can be enabled.

Method of Manufacturing an Ingot

A method of manufacturing an ingot comprises a preparation step arranging a material 300 and a seed to be in separation to an ingot growing container 200 having internal space; a growth step of adjusting the temperature, pressure, and atmosphere of the internal space thereby sublimating the material and allowing an ingot 100 to grow on the seed; and a cooling step of cooling the ingot growing container and retrieving the ingot.

The ingot may be a silicon carbide ingot.

The material may comprise carbon and silicon sources, and for example, may comprise silicon carbide particles.

The seed may be a silicon carbide seed.

The seed may be a 4H silicon carbide seed.

The growth step may proceed in atmosphere of inert gas having flux of 100 sccm to 300 sccm.

The cooling step may proceed in atmosphere of inert gas having flux of 1 sccm to 250 sccm.

The thermal conductivity of the ingot growing container may be 120 W/mK or less.

A wafer may be prepared by cutting an ingot retrieved after the cooling step, and wrapping and polishing of the surface.

The material (P) in the preparation step may be a powder form having carbon and silicon sources, and may be a material in which the powder is treated with necking or a silicon carbide powder of which the surface is carbonized.

The ingot growing container 200 in the preparation step may be a container suitable for growth reaction of an ingot, and specifically may be a graphite crucible. For example, the ingot growing container may comprise a body 210 comprising internal space and an opening, and a cover 220 corresponding the opening and covering tightly the internal space. The cover may further comprise a holder for a seed, integrally or separately from the cover, and a seed can be fixed to confront the material, by the holder for a seed.

The ingot growing container in the preparation step may have characteristics described above.

Additionally, the ingot growing container may have a thermal conductivity characteristic described below.

The ingot growing container 200 in the preparation step may have thermal conductivity of 120 W/mK or less, and of 85 W/mK or more. When the thermal conductivity of the ingot growing container is less than 85 W/mK, a temperature gradient of an ingot growing container becomes to be excessive during growth of an ingot, so that probability of crack occurrence of an ingot may be increased, and internal stress inside the ingot may be increased. When the thermal conductivity of the ingot growing container is 120 W/mK or more, a current is decreased during induction heating, and internal heating temperature is also decreased, so that growth rate of an ingot may be lowered, and impurities may be increased.

By applying the ingot growing container having the above range of thermal conductivity, the temperature gradient of the ingot growing container can be stabilized, and the ingot manufactured by following step can obtain purposed mechanical properties.

The ingot growing container 200 in the preparation step may be fixed by surrounding with an insulating material 400, and the ingot growing container surrounded with the insulating material may be accommodated by a reacting chamber 500 like a quartz tube. The temperature of internal space of the ingot growing container can be controlled by a heating means 600 equipped in the external of the insulating material and the reacting chamber.

The heating means 600 may be an induction heating means in the coil shape. If an alternating current in a high frequency is supplied to the induction heating means, an eddy current is generated in the ingot growing container 200, and accordingly internal space of an ingot growing container may be heated by Joule's heat generated by resistance of an ingot growing container.

The insulating material 400 in the preparation step may have porosity of 72% to 95%, of 75% to 93%, or of 80% to 91%. When an insulating material satisfying the above porosity is applied, crack occurrence of a growing ingot can be more decreased.

The insulating material 400 may have a compressive strength of 0.2 Mpa or more, of 0.48 Mpa or more, or of 0.8 Mpa or more. In addition, the insulating material may have a compressive strength of 3 Mpa or less, or of 2.5 MPa or less. When the insulating material have these compressive strength, thermal/mechanical stability is excellent, and probability of ash occurrence is lowered, so that a silicon carbide ingot with more excellent quality can be manufactured.

The insulating material 400 in the preparation step may have a thermal conductivity at 2000° C. of 1.79 W/mK or less, or of 1.24 W/mK or less. The thermal conductivity of the insulating material at 2000° C. may be 0.3 or more, or 0.48 W/mK or more.

Heat emission of the ingot growing container 200 during growth of an ingot is blocked and simultaneously stable temperature gradient can be formed, through the insulating material having the above range of thermal conductivity.

The insulating material 400 in the preparation step may have a density of 0.13 g/cc or more, or of 0.17 g/cc or more. The insulating material may have a density of 0.28 g/cc or less, or of 0.24 g/cc or less. Occurrence of bend and twist can be prevented, through an insulating material having the above range of density.

The reacting chamber 500 in the preparation step may comprise a vacuum exhauster 700 connected to the internal of the reacting chamber and adjusting the degree of vacuum inside the reacting chamber, a pipe 810 connected to the internal of the reacting chamber and allowing gas to flow in the internal of the reacting chamber and a mass flow controller 800 controlling the same. The flux of inert gas can be adjusted through them in following growth and cooling steps.

The growth step is a step of adjusting the temperature, pressure, and atmosphere of the internal space thereby sublimating the material 300 and allowing an ingot 100 to grow on the seed.

The growth step may be performed by heating the ingot growing container 200 and internal space of the ingot growing container using the heating means 600, and simultaneously with the heating or separately depressurizing internal space to adjust pressure, and injecting inert gas may be performed for growth of a silicon carbide ingot to be induced.

The growth step may be performed in temperature of 2000° C. to 2600° C. and pressure condition of 1 torr to 200 torr, and a silicon carbide ingot may be manufactured more efficiently in the above range of temperature and pressure.

The growth step may be exemplarily performed under the condition in which the temperature in upper portion and lower portion of the ingot growing container 200 is 2100° C. to 2500° C., and the pressure of internal space of the ingot growing container is 1 torr to 50 torr, or may be performed under the condition in which the temperature in upper portion and lower portion of the ingot growing container 200 is 2150° C. to 2350° C., and the pressure of internal space of the ingot growing container is 1 torr to 30 torr. When the above condition of the temperature and pressure is applied to the growth step, a silicon carbide ingot with more high quality can be manufactured.

The growth step may increase temperature to the above range of temperature in rate of increasing temperature of 1° C./min to 10° C./min, or in rate of increasing temperature of 5° C./min to 10° C./min, and may comprise a pre-growth process having a relatively high temperature for increasing temperature and a growth proceeding process having a relatively low temperature for increasing temperature.

The growth step may add inert gas of fixed flux into the internal of the ingot growing container 200. Exemplarily, the inert gas may flow in the direction from the material 300 to the seed. At this time, the growth step may be performed in atmosphere of inert gas having flux of 100 sccm to 300 sccm, or may be performed in atmosphere of inert gas having flux of 150 sccm to 250 sccm. When the flux is less than 100 sccm, the amount of impurities may be increased due to decreasing of sublimated amount of the material, and when the flux is greater than 300 sccm, the growth rate of an ingot excessively rise so that the quality of an ingot may be degraded. Stable temperature gradient of the ingot growing container and internal space thereof can be formed, and sublimation of the material can be done easily by performing a growth step in the above range of flux, so that an ingot can obtain purposed mechanical properties.

The inert gas in the growth step, for example, may be argon, helium, and mixed gas thereof, and may also comprise nitrogen in a small amount.

The cooling step is a step of cooling the grown silicon carbide ingot under the condition of a fixed cooling rate and flux of inert gas.

The cooling step may perform cooling in a rate of 1° C./min to 10° C./min, or 3° C./min to 9° C./min. The cooling step may perform cooling in a rate of 5° C./min to 8° C./min.

The cooling step may add inert gas in a fixed small amount into the internal of the ingot growing container 200, like the growth step. Exemplarily the inert gas may flow in the direction from the material 300 to the silicon carbide seed. At this time, the cooling step may be performed in atmosphere of inert gas having flux of 1 sccm to 300 sccm, or may be performed in atmosphere of inert gas having flux of 10 sccm to 250 sccm. When the flux is less than 1 sccm, cooling efficiency of an ingot is decreased, and temperature gradient of an ingot growing container becomes excessive so that the probability of crack occurrence and internal stress of an ingot may be increased. When the flux is greater than 300 sccm, cooling rate is excessively increased so that the probability of crack occurrence and internal stress of an ingot may be increased. If the cooling step is performed in the above range of flux, stable temperature gradient of the ingot growing container and internal space can be formed, and cooling of the ingot can be done easily so that purposed mechanical properties can be achieved.

The flux (Fg) of inert gas in the growth step and the flux (Fc) of inert gas in the cooling step may have a ratio of 0.33 to 30, of 0.6 to 25, or of 0.6 to 6. In growth and cooling steps gradual change of flux can be done by having such a flux ratio, and a silicon carbide ingot to be grown and cooled can have superior mechanical properties.

In the cooling step adjusting pressure of internal space of the ingot growing container 200 may be done simultaneously, or separately with the cooling step. The adjusting pressure may be done for the internal space to have a pressure of maximum 800 torr.

The retrieving of the cooling step may be performed by cutting the rear of the ingot meeting the seed. The ingot retrieved in this manner may be processed to have a wafer form through following processes.

Hereinafter, the present disclosure will be described through example embodiments in more detail below. The below examples are only exemplification to help understanding of the present disclosure, and the range of the present disclosure is not limited thereto.

Example A

Example A-1: Preparation of an Apparatus for Measuring an Ingot Growing Container 100*a* Equipped with a Coil 10 in the Flat Spiral Coil Shape Like an example illustrated in FIG. 1, a graphite crucible having an outer diameter (Do) of 201 mm, and an inner diameter of 190 mm was prepared as an ingot growing container, and a coil in the flat spiral coil shape was prepared having an inner circumference surface of a flat spiral coil adjoining the outer circumference surface of the crucible. The coil in the flat spiral shape have the number of winding of a conducting wire of fourteen times, with being located on the same plane. As for the coil, a litz wire having a diameter of 3.5 mm in which a wire of 750 strands having a diameter of 0.1 mm is twisted and covered was used. The inner diameter of the flat spiral coil was 210 mm, and the outer diameter of the flat spiral coil was 325 mm. A thickness in x direction of the flat spiral coil, which is horizontal direction to the bottom of the crucible, is fourteen times with respect to a thickness in z direction, which is horizontal to the vertical direction of the side of an ingot growing container. In addition, a ratio of the perimeter length to the diameter of a litz wire was 100:0.58.

Withdrawal wires 12*a*, 12*b* that were both end portions of a litz wire consisting the flat spiral coil were connected to an LCR meter (HIOKI 3522-50), and zero point was adjusted to have a value of electromagnetic properties (any one out of equivalent series resistance, equivalent series inductance, and quality factor) of 0 in the coil when AC power of 100 kHz and 0.1 A was applied. Before the zero point was adjusted, a value of equivalent series inductance of the coil was 35.1 uH, and a value of equivalent series resistance was 51.1 mΩ.

Example A-2: Preparation of an Apparatus for Measuring an Ingot Growing Container 100*a* Equipped with a Coil 10 in the Aircore Coil Shape A graphite crucible having an outer diameter (Do) of 210 mm, and an inner diameter of 190 mm was prepared as an ingot growing container, and a coil having an inner circumference surface adjoining the outer circumference surface of the crucible, substantially, to be corresponded with the outer circumference surface of the crucible, and having the number of winding of 27 times was prepared. As for the conducting wire, a litz wire having a diameter of 3.5 mm in which a wire of 750 strands having a diameter of 0.1 is twisted and covered. The inner diameter of the aircore coil was 211 mm, the outer diameter of the aircore coil was 224 mm, and a thickness in z direction of the aircore coil which was horizontal to the vertical direction of the side of the crucible was twenty-seven times with respect to a thickness in x direction which was horizontal to the bottom of the crucible. In addition, a ratio of the perimeter of the crucible to the diameter of a litz wire was 100:0.58.

Withdrawal wires 12*a*, 12*b* that were both end portions of a litz wire consisting the aircore coil were connected to an LCR meter (HIOKI 3522-50), and zero point was adjusted to have a value of electromagnetic properties (any one out of equivalent series resistance, equivalent series inductance, and quality factor) of 0 in the coil when AC power of 100 kHz and 0.1 A was applied. Before the zero point was adjusted, a value of equivalent series inductance of the coil was 131 uH, and a value of equivalent series resistance was 1.03 mΩ.

Example A-3: Measurement of Electromagnetic Properties of an Ingot Growing Container 1

The inner circumference surface of the coil in the flat spiral coil shape in the prepared ingot growing container 100*a* was allowed to adjoin the lowest portion of the outer circumference surface of a graphite ingot growing container 200 in a cylinder shape having internal space, an outer diameter of 105 mm, and a weight of Table 1 and Table 2, like FIG. 1. AC power of 100 kHz and 0.1 A was applied to the coil through an LCR meter, and induced equivalent series resistance (Rs), equivalent series inductance (Ls), and quality factor (Q). The time required for measurement was about 20 seconds.

Example A-4: Measurement of Electromagnetic Properties of an Ingot Growing Container 2

The ingot growing container 200 in the measurement 1 was allowed to be accommodated in the internal of a coil in the flat spiral coil shape with a fixed interval (52.5 mm) in the prepared apparatus for measuring an ingot growing container 100*b*. AC power of 100 kHz and 0.1 A was applied to the coil through an LCR meter, and induced equivalent series resistance (Rs), equivalent series inductance (Ls), and quality factor (Q) were measured. The time required for measurement was about 20 seconds.

Example A-5: Growth of a Silicon Carbide Ingot Through a Measured Ingot Growing Container and Measurement of Growth Rate Silicon carbide material was charged in a lower portion of internal space of an ingot growing container in Table 1 and Table 2, and a silicon carbide seed was arranged in the upper portion. The ingot growing container was covered up, and the external was arranged inside a reacting chamber equipped with a heating coil.

The internal space of the ingot growing container was depressurized thereby being adjusted to have vacuum atmosphere, and argon gas was injected for the internal space to reach atmospheric pressure, and the internal space was depressurized again. Simultaneously, a temperature of internal space was increased to the temperature of 2500° C. in a rate of 5 to 10° C./min by applying power to the heating coil, and a silicon carbide ingot was allowed to grow in the plane of a silicon carbide seed opposite to silicon carbide material for 100 hours under the pressure condition of 5 torr. At this time, a value of direct current of an ingot growing container and a growth rate of an ingot were measured and checked by applying the same power with an ingot growing process in 2200 to 2400° C. based on a temperature of the lower portion of an ingot growing container when the ingot growing process was performed using an apparatus for growth.

TABLE 1

| Distinction | Weight(g) | a Value Induced in a Flat Spiral Coil | | | a Value Induced in a Aircore Coil | | | Direct Current | Growth Rate |
|---|---|---|---|---|---|---|---|---|---|
| | | Ls(uH) | Rs(Ω) | Q | Ls(uH) | Rs(Ω) | Q | (A) | (mm/hr) |
| Example 1 | 5554 | 37.15 | 3.45 | 6.76 | 100.38 | 5.32 | 11.84 | 41 | 153 |
| Example 2 | 5556 | 37.43 | 3.37 | 6.96 | 100.3 | 5.29 | 11.89 | 40 | 150 |
| Example 3 | 5600 | 37.77 | 3.2 | 7.4 | 100.85 | 4.99 | 12.68 | 37 | 164 |
| Example 4 | 5732 | 37.99 | 3.08 | 7.74 | 101.08 | 4.82 | 13.16 | 36 | 142 |
| Example 5 | 5762 | 38.06 | 3.09 | 7.74 | 101.19 | 4.83 | 13.14 | 36 | 138 |
| Example 6 | 5770 | 38.04 | 3.08 | 7.76 | 101.32 | 4.77 | 13.33 | 36 | 159 |
| Example 7 | 5774 | 38.08 | 3.07 | 7.78 | 101.32 | 4.78 | 13.32 | 36 | 124 |
| Example 8 | 5776 | 38.02 | 3.07 | 7.77 | 101.34 | 4.79 | 13.27 | 36 | 158 |
| Example 9 | 5784 | 38.11 | 3.03 | 7.89 | 101.45 | 4.71 | 13.51 | 35.5 | 147 |
| Example 10 | 5788 | 37.96 | 3.07 | 7.77 | 101.4 | 4.76 | 13.37 | 36 | 165 |
| Example 11 | 5808 | 38.21 | 2.99 | 8 | 101.47 | 4.66 | 13.66 | 35 | 148 |
| Example 12 | 5808 | 38.26 | 3 | 8.03 | 101.52 | 4.67 | 13.65 | 34.5 | 159 |
| Example 13 | 5810 | 38.19 | 3 | 7.98 | 101.46 | 4.67 | 13.62 | 35 | 138 |
| Example 14 | 5838 | 36.82 | 3.65 | 6.33 | 99.41 | 5.79 | 10.77 | 44 | 116 |
| Example 15 | 5842 | 38.08 | 3.04 | 7.87 | 101.43 | 4.69 | 13.57 | 35 | 137 |

(Ls: Equivalent Series Inductance, Rs: Equivalent Series Resistance, Q: Quality Factor)

TABLE 2

| Distinction | Weight(g) | A Value Induced in a Flat Spiral Coil | | | A Value Induced in a Aircore Coil | | | Direct Current | Growth Rate |
|---|---|---|---|---|---|---|---|---|---|
| | | Ls(uH) | Rs(Ω) | Q | Ls(uH) | Rs(Ω) | Q | (A) | (mm/hr) |
| Example 16 | 5842 | 36.59 | 3.7 | 6.21 | 99.38 | 5.79 | 10.77 | 43 | 121 |
| Example 17 | 5844 | 36.69 | 3.7 | 6.24 | 99.38 | 5.8 | 10.76 | 44 | 113 |
| Example 18 | 5856 | 38.14 | 3.04 | 7.87 | 101.41 | 4.67 | 13.63 | 35 | 138 |
| Example 19 | 5866 | 38.15 | 3.02 | 7.92 | 101.52 | 4.65 | 13.71 | 35 | 142 |
| Example 20 | 5866 | 36.56 | 3.74 | 6.14 | 99.22 | 5.91 | 10.54 | 44 | 94 |
| Example 21 | 5880 | 36.84 | 3.59 | 6.45 | 99.44 | 5.72 | 10.91 | 43 | 103 |
| Example 22 | 5882 | 36.61 | 3.71 | 6.19 | 99.22 | 5.91 | 10.54 | 44 | 98 |
| Example 23 | 5892 | 36.84 | 3.62 | 6.39 | 99.6 | 5.71 | 10.96 | 43 | 107 |
| Example 24 | 5894 | 36.79 | 3.68 | 6.27 | 99.3 | 5.81 | 10.73 | 44 | 105 |
| Example 25 | 5922 | 36.79 | 3.64 | 6.34 | 99.55 | 5.74 | 10.88 | 43.5 | 108 |
| Example 26 | 5926 | 36.97 | 3.59 | 6.47 | 99.63 | 5.65 | 11.06 | 43 | 101 |
| Example 27 | 5934 | 36.71 | 3.63 | 6.35 | 99.44 | 5.77 | 10.81 | 43 | 102 |
| Example 28 | 5950 | 36.95 | 3.59 | 6.47 | 99.77 | 5.63 | 11.12 | 43 | 99 |
| Example 29 | 5954 | 36.74 | 3.63 | 6.35 | 99.48 | 5.77 | 10.83 | 43.5 | 94 |
| Example 30 | 5954 | 36.99 | 3.56 | 6.52 | 99.8 | 5.59 | 11.21 | 42.5 | 103 |

(Ls: Equivalent Series Inductance, Rs: Equivalent Series Resistance, Q: Quality Factor)

Referring to Table 1 and Table 2, and FIG. 3 and FIG. 4, the Ls value induced in the flat spiral coil showed linear relation having a coefficient of determination of 0.9834 with the value of direct current (FIG. 3A). The Rs value induced in the flat spiral coil showed linear relation having a coefficient of determination of 0.9915 with the value of direct current (FIG. 3B). In addition, the Q value induced in the flat spiral coil showed linear relation having a coefficient of determination of 0.9924 with the value of direct current (FIG. 3C). Additionally, the Ls value induced in the aircore coil showed linear relation having a coefficient of determination of 0.9841 with the value of direct current (FIG. 4A). The Rs value induced in the aircore coil showed linear relation having a coefficient of determination of 0.9907 with the value of direct current (FIG. 4B). Additionally, the Q value induced in the aircore coil showed linear relation having a coefficient of determination of 0.9922 with the value of direct current (FIG. 4C). These mean that the accuracy of prediction is considerably high.

That is, the Ls, Rs and Q value induced in the flat spiral coil and aircore coil show linear relation of which the coefficient of determination with the value of direct current is 0.98 or more, and thereby it is verified that a plurality of ingot growing containers can be selected to show similar direct current values when applied to growth of an ingot through induction heating.

Example B

Example B-1: Preparation of a Coil in an Aircore Coil Shape and an Ingot Growing Container A coil having a winding number of a conducting wire of twenty-five times and an aircore coil shape was prepared. As for the conducting wire a litz wire having a diameter of 3.5 mm in which a wire of 750 strands having a diameter of 0.1 mm was twisted and covered. The inner diameter of the coil was 172 mm, and the outer diameter of the coil was 180 mm, and a thickness in z direction of the coil, which was horizontal to the vertical direction of the side of an insulating material in a cylinder shape to be measured, was twenty-five times with respect to a thickness in x direction which was horizontal to the bottom of the insulating material.

Withdrawal wires 12a, 12b that were both ends of a litz wire of the coil were connected to an LCR meter (HIOKI 3522-50), and a zero point was adjusted to have a value of 0 of electromagnetic properties (any one out of equivalent series resistance, equivalent series inductance, quality factor) of the coil when AC power of 100 kHz and 0.1 A was applied. Before the zero point was adjusted, a value of equivalent series inductance of the coil was 131 uH, and a value of equivalent resistance was 4.01Ω.

Example B-2: Growth of an Ingot Through an Insulating Material Selected by Measuring Electromagnetic Properties Between a graphite ingot growing container having internal space, an outer diameter (Do) of 180 mm, and a cylinder shape, and an inner circumference surface of an insulating material surrounding the same and having a weight in Table 3, the coil in the prepared apparatus for measuring an insulating material was allowed to be arranged like FIG. 9. Through an LCR meter AC power of 100 kHz and 0.1 A was applied, and induced equivalent resistance (Rs), equivalent series inductance (Ls) and quality factor (Q) were measured. The time required for measurement was about 20 seconds.

Thereafter, a silicon carbide seed was arranged in an upper portion of the internal of an ingot growing container surrounded with an insulating material having a measured value of equivalent series resistance of 11.88Ω to 12.87Ω, and silicon carbide material powder was arranged in a lower portion. The ingot growing container was covered up, and the external was arranged inside a reacting chamber equipped with a heating coil.

By depressurizing internal space of the ingot growing container was adjusted to have vacuum atmosphere, and argon gas was injected for the internal space to reach atmospheric pressure, and after that the internal space was depressurized again. Simultaneously, the temperature of internal space was increased to the temperature of 2500° C. in a rate of increasing temperature of 5~10° C./min, by applying power to the heating coil, and a silicon carbide ingot was allowed to grow in a plane of a silicon carbide opposite to silicon carbide material for 100 hours under the pressure condition of 5 torr. At this time, the average growth rate of a silicon carbide ingot was shown in Table 3.

Example B-3: Growth of an Ingot Through an Optional Insulating Material Unmeasured for Electromagnetic Properties Except one case in which an ingot growing container surrounded with optional insulating material unmeasured for the electromagnetic properties was applied, a silicon carbide ingot was allowed to grow in the same manner with the above example, and at this time the average growth rate of silicon carbide ingots was shown in Table 3.

TABLE 3

| | Weight(g) | Rs(Ω)* Induced in a Coil | Growth Rate(μm/hr) |
|---|---|---|---|
| Example 1 | 474 | 12.70 | 0.13 |
| Example 2 | 489 | 12.83 | 0.13 |
| Example 3 | 484 | 12.83 | 0.13 |
| Example 4 | 474 | 12.63 | 0.13 |
| Example 5 | 484 | 12.80 | 0.13 |
| Example 6 | 481 | 12.75 | 0.13 |
| Example 7 | 474 | 12.59 | 0.12 |
| Example 8 | 483 | 12.87 | 0.12 |
| Example 9 | 480 | 12.78 | 0.12 |
| Example 10 | 475 | 12.62 | 0.14 |
| Example 11 | 477 | 12.60 | 0.14 |
| Example 12 | 478 | 12.76 | 0.14 |
| Example 13 | 457 | 11.88 | 0.12 |
| Example 14 | 494 | 12.00 | 0.12 |
| Example 15 | 496 | 11.95 | 0.12 |
| Comparative Example 1 | 488 | Unmeasured | 0.04 |
| Comparative Example 2 | 498 | Unmeasured | 0.04 |
| Comparative Example 3 | 508 | Unmeasured | 0.04 |

Rs(Ω)*: Equivalent Series Resistance

Observing Table 3 and FIG. 11, it was verified that Example 1 to Example 15 of growing silicon carbide ingots with ingot growing containers surrounded with insulating material having a measured value of equivalent series resistance of 11.88Ω to 12.87Ω showed a growth rate of 0.12 μm/hr to 0.14 μm/hr. While Comparative Example 1 to Comparative Example 3 of growing silicon carbide ingots with ingot growing containers surrounded with optional insulting material without measuring electromagnetic properties showed a growth rate of 0.04 μm/hr.

Example B-4: Comparison of Correlation Between a Weight of Insulating Material and a Measured Value of the Apparatus for Measuring the Insulating Material Correlation between a value of equivalent series resistance of insulating material measured in the examples and comparative examples, and a weight of insulating material was shown in FIG. 10. Referring this, a weight of insulating material and a measured value of equivalent series resistance have a coefficient of determination ($R^2$) of 0.5728, and it is verified that the correlation thereof is weak. When the insulating material is selected through only weight and an ingot is allowed to grow through this, it can be difficult to secure reproducibility of growth of an ingot, like the result shown in the comparative examples.

Insulating materials having similar electromagnetic properties are selected through the apparatus for measuring an insulating material and the selected insulating material is applied as an insulating material of an ingot growing container thereby enabling effective growth of an ingot.

Example C (Growth of a Silicon Carbide Ingot Through an Ingot Growing Container, and Measurement of Growth Rate)

The result of Example 1 to 30 which was the same with Example A was shown in below Table 4 and Table 5 with values of Pr and Pl. Specifically, silicon carbide material (P) was charged in a lower portion of internal space of an ingot growing container, and a silicon carbide seed was arranged in an upper portion of internal space of the ingot growing container. The ingot growing container 200 was covered up, and the external was arranged inside a reacting chamber 500 equipped with a heating coil 600.

The internal space of the ingot growing container was adjusted to have vacuum atmosphere by depressurizing with a vacuum exhauster 700, and the internal space was allowed to reach atmospheric pressure by injecting argon gas, after that the internal space was depressurized again. At the same time, the temperature of internal space was increased to 2500° C. in a rate of 5 to 10° C./min by applying power to the heating coil, and a silicon carbide ingot was allowed to grow in a plane of a silicon carbide seed opposite to silicon carbide material for 100 hours under the condition of 5 torr. Adjusting of internal pressure was performed by a flow controller 800 and a pipe 810 connected to the same.

At this time, a direct current value of an ingot growing container and growth rate of an ingot were measured and checked by applying the same power with an ingot growing process in 200 to 2400° C. based on a temperature of a lower portion of the ingot growing container when the ingot growing process was performed using an apparatus for growth. Pr and Pl values were evaluated with the above Evaluation 1 and Evaluation 2.

TABLE 4

| Distinction | Weight (g) | Pr | Pl | Direct Current (A) | Growth Rate (mm/hr) |
|---|---|---|---|---|---|
| Example 1 | 5554 | 6.21 | 6.69 | 41 | 153 |
| Example 2 | 5556 | 6.07 | 6.74 | 40 | 150 |
| Example 3 | 5600 | 5.71 | 6.74 | 37 | 164 |
| Example 4 | 5732 | 5.37 | 6.63 | 36 | 142 |
| Example 5 | 5762 | 5.36 | 6.61 | 36 | 138 |
| Example 6 | 5770 | 5.34 | 6.59 | 36 | 159 |
| Example 7 | 5774 | 5.32 | 6.60 | 36 | 124 |
| Example 8 | 5776 | 5.32 | 6.58 | 36 | 158 |
| Example 9 | 5784 | 5.24 | 6.59 | 35.5 | 147 |
| Example 10 | 5788 | 5.30 | 6.56 | 36 | 165 |
| Example 11 | 5808 | 5.15 | 6.58 | 35 | 148 |
| Example 12 | 5808 | 5.17 | 6.59 | 34.5 | 159 |
| Example 13 | 5810 | 5.16 | 6.57 | 35 | 138 |
| Example 14 | 5838 | 6.25 | 6.31 | 44 | 116 |
| Example 15 | 5842 | 5.20 | 6.52 | 35 | 137 |

TABLE 5

| Distinction | Weight (g) | Pr | Pl | Direct Current (A) | Growth Rate (mm/hr) |
|---|---|---|---|---|---|
| Example 16 | 5842 | 6.33 | 6.26 | 43 | 121 |
| Example 17 | 5844 | 6.33 | 6.28 | 44 | 113 |
| Example 18 | 5856 | 5.19 | 6.51 | 35 | 138 |
| Example 19 | 5866 | 5.15 | 6.50 | 35 | 142 |
| Example 20 | 5866 | 6.38 | 6.23 | 44 | 94 |
| Example 21 | 5880 | 6.11 | 6.27 | 43 | 103 |
| Example 22 | 5882 | 6.31 | 6.22 | 44 | 98 |
| Example 23 | 5892 | 6.14 | 6.25 | 43 | 107 |
| Example 24 | 5894 | 6.24 | 6.24 | 44 | 105 |
| Example 25 | 5922 | 6.15 | 6.21 | 43.5 | 108 |
| Example 26 | 5926 | 6.06 | 6.24 | 43 | 101 |
| Example 27 | 5934 | 6.12 | 6.19 | 43 | 102 |
| Example 28 | 5950 | 6.03 | 6.21 | 43 | 99 |
| Example 29 | 5954 | 6.10 | 6.17 | 43.5 | 94 |
| Example 30 | 5954 | 5.98 | 6.21 | 42.5 | 103 |

Referring to Table 4 and Table 5, when data about electromagnetic indirect properties were insufficiently secured, the trend of growth rate of an ingot can be predicted to a certain degree, and showed linear result of 0.83 or more, though the result was not shown in drawings, so that it was verified that prediction in a considerable degree and efficient operation of the process can be enabled.

Hereinabove, the preferred embodiments of example embodiments have been described in detail, but the scope of the present disclosure should not be limited thereto, and various modifications and improvements made by a person of ordinary skill in the art with using a basic concept defined by the following claims should also be construed to belong to the scope of the present disclosure.

What is claimed is:

1. A method of measuring properties that relate to an induction heating characteristic of a graphite article, the method comprising:
    an arranging step of arranging a graphite article to be able to be electromagnetically engaged with a coil comprising a winded conducting wire; and
    a measuring step of applying power for measurement to the coil through a means of measurement connected electronically to the coil, thereby measuring electromagnetic properties induced to the coil,
    wherein the coil has a perimeter length of an inner circumference, and
    wherein the perimeter length (unit:mm) of the inner circumference and the sectional area (unit:mm$^2$) of conducting wires of the coil have a ratio of 100:1.57 to 161.

2. The method of in claim 1,
    wherein the electromagnetic properties comprise a property relating to change of induced electromotive force generated in the coil by the graphite article or a property relating to resistance of the graphite article.

3. The method of in claim 1,
    wherein the electromagnetic properties are one or more selected from the group consisting of equivalent series resistance, equivalent series inductance, and quality factor of the coil.

4. The method of in claim 1,
    wherein the graphite article is an ingot growing container and/or an insulating material.

5. The method of in claim 4,
    wherein the coil has accommodation space located in the internal,
    the ingot growing container is arranged in the accommodation space, and
    the insulating material is arranged in the external of the coil.

6. The method of in claim 5,
    wherein the length of the accommodation space is 100 mm or more.

7. A method of measuring properties that relates to an induction heating characteristic of a graphite article comprises:
    an arranging step of arranging a graphite article to be able to be electromagnetically engaged with a coil comprising a winded conducting wire; and
    a measuring step of applying power for measurement to the coil through a means of measurement connected electronically to the coil, thereby measuring electromagnetic properties induced to the coil,
    wherein a section of the coil has a thickness in x direction measured in x direction which is horizontal to the bottom or the top of the graphite article and a thickness in z direction measured in z direction which is the side direction of the graphite article and perpendicular to the x direction, and
    wherein the coil has a flat spiral coil shape in which the thickness in x direction is the same with or greater than the thickness in z direction.

8. The method of in claim 7,
wherein the coil in the flat spiral coil shape has a perimeter length of an inner circumference,
wherein the perimeter length (unit:mm) of the inner circumference and the thickness (mm) of the conducting wire have a ratio of 100:0.194 to 1.09.

9. The method of in claim 7,
wherein the graphite article is an ingot growing container,
wherein the ingot growing container has a value of equivalent series resistance of 2.35Ω to 4.56Ω measured by applying AC power of 100 kHz and 0.1 A.

10. The method of in claim 1,
wherein the section of the coil has a thickness in x direction measured in x direction which is horizontal to the bottom or the top of the graphite article and a thickness in z direction measured in z direction which is the side direction of the graphite article and perpendicular to the x direction,
wherein the coil has an aircore coil shape in which the thickness in z direction is greater than the thickness in x direction.

11. The method of in claim 10,
wherein the coil in the aircore coil shape has a perimeter length of inner circumference,
wherein the perimeter length (unit:mm) and the thickness (mm) of the conducting wire has a ratio of 100:0.194 to 1.09.

12. The method of in claim 10,
wherein the graphite article is an ingot growing container,
wherein the ingot growing container has a value of equivalent series resistance of 3.50Ω to 7.24 measured by applying AC power of 100 kHz and 0.1 A.

13. The method of in claim 10,
wherein the graphite article is an insulating material,
wherein the insulating material has a value of equivalent series resistance of 10.57Ω to 14.16Ω measured by applying AC power of 100 kHz and 0.1 A.

14. A measuring apparatus, comprising:
a coil comprising a winded conducting wire; and
a means of measurement connected electronically to the coil,
wherein the means of measurement applies power for measurement to the coil thereby measuring electromagnetic properties of a graphite article,
wherein the electromagnetic properties are properties relating an induction heating characteristic,
wherein the coil has a perimeter length of an inner circumference, and
wherein the perimeter length (unit:mm) of the inner circumference and the sectional area (unit:mm$^2$) of conducting wires of the coil have a ratio of 100:1.57 to 161.

15. The apparatus of claim 14,
wherein the electromagnetic properties are one or more selected from the group consisting of equivalent series resistance, equivalent series inductance, and quality factor of the coil.

16. The apparatus of claim 14,
wherein the section of the coil has a thickness in x direction measured in x direction which is horizontal to the bottom or the top of the graphite article and a thickness in z direction measured in z direction which is the side direction of the graphite article and horizontal to the x direction,
wherein the coil has a flat spiral coil shape in which a thickness in x direction is the same with or greater than the thickness in z direction, or has an aircore coil shape in which the thickness in z direction is greater than the thickness in x direction.

17. An ingot growing system comprising a graphite article and a heating means thereby allowing a silicon carbide ingot to grow, comprises:
a body having internal space in which material is arranged; and
a silicon carbide seed arranged in an upper portion of the body or in the body,
wherein the graphite article is an ingot growing container or an insulating material,
the graphite article has a value of equivalent series resistance which is an electromagnetic indirect property measured by an apparatus of measurement,
the ingot growing container has a value of equivalent series resistance of 3.50Ω to 7.24Ω measured by applying AC power of 100 kHz and 0.1 A, and
the insulating material has a value of equivalent series resistance of 10.57Ω to 14.16Ω measured by applying AC power of 100 kHz and 0.1 A.

18. The ingot growing system in claim 17,
wherein the silicon carbide ingot is induced to grow in a rate of 100 mm/hr or more.

19. A measuring apparatus, comprising:
a coil comprising a winded conducting wire; and
a means of measurement connected electronically to the coil,
wherein the means of measurement applies power for measurement to the coil thereby measuring electromagnetic properties of a graphite article,
wherein the electromagnetic properties are properties relating an induction heating characteristic,
wherein the section of the coil has a thickness in x direction measured in x direction which is horizontal to the bottom or the top of the graphite article and a thickness in z direction measured in z direction which is the side direction of the graphite article and perpendicular to the x direction, and
wherein the coil has a flat spiral coil shape in which the thickness in x direction is the same with or greater than the thickness in z direction.

* * * * *